US006641977B2

(12) United States Patent
Oohashi

(10) Patent No.: US 6,641,977 B2
(45) Date of Patent: Nov. 4, 2003

(54) LITHOGRAPHIC PRINTING PLATE PRECURSOR

(75) Inventor: Hidekazu Oohashi, Shizuoka (JP)

(73) Assignee: Fuji Photo Film Co., Ltd., Minami-Ashigara (JP)

(*) Notice: Subject to any disclaimer, the term of this patent is extended or adjusted under 35 U.S.C. 154(b) by 63 days.

(21) Appl. No.: 10/061,234

(22) Filed: Feb. 4, 2002

(65) Prior Publication Data

US 2002/0172889 A1 Nov. 21, 2002

(30) Foreign Application Priority Data

Feb. 6, 2001 (JP) ....................................... 2001-029631

(51) Int. Cl.[7] ................................................ G03F 7/039

(52) U.S. Cl. ................. 430/273.1; 430/138; 430/270.1; 430/271.1; 430/302

(58) Field of Search .............................. 430/138, 270.1, 430/271.1, 273.1, 300, 302, 348, 944, 945, 964

(56) References Cited

U.S. PATENT DOCUMENTS

| | | | | | |
|---|---|---|---|---|---|
| 6,358,669 | B1 | * | 3/2002 | Savariar-Hauck et al. | 430/273.1 |
| 6,391,519 | B1 | * | 5/2002 | Kunita | 430/270.1 |
| 6,472,055 | B1 | * | 10/2002 | Tashiro et al. | 428/212 |
| 2002/0117066 | A1 | * | 8/2002 | Kawamura et al. | 101/462 |

FOREIGN PATENT DOCUMENTS

| | | | |
|---|---|---|---|
| JP | 9-123387 | A | 5/1997 |
| JP | 9-123388 | A | 5/1997 |
| JP | 9-127683 | A | 5/1997 |
| JP | 9-131850 | A | 5/1997 |
| JP | 2000-221667 | A | 8/2000 |
| WO | WO99/10186 | A1 | 3/1999 |

* cited by examiner

*Primary Examiner*—Janet Baxter
*Assistant Examiner*—Barbara Gilliam
(74) *Attorney, Agent, or Firm*—Burns, Doane, Swecker & Mathis, LLP

(57) ABSTRACT

A lithographic printing plate precursor comprising: a support having a water-wettable surface; and a heat-sensitive layer comprising a first resin having a hydrogen-donating group and a second resin having a hydrogen-accepting group, wherein at least one of the first resin and the second resin is particles.

10 Claims, No Drawings

LITHOGRAPHIC PRINTING PLATE PRECURSOR

FIELD OF THE INVENTION

This invention relates to a lithographic printing plate precursor and, more particularly, to a lithographic printing plate precursor which exhibits high sensitivity and is fit for scanning exposure based on digital signals, which can be mounted on a printing press after development with water or without development to carry out printing. A printing plate prepared therefrom has a long press life and provides stain-free printed matter.

BACKGROUND OF THE INVENTION

Computer-to-plate (CTP) technology has recently seen marked development, and a number of studies have been given to printing plate precursors for CTP. In particular, processless plate precursors that can be mounted on a printing press after imagewise exposure without requiring chemical development have been researched in the art, and various techniques have been proposed to data.

A so-called onpress development system is one of the methods realizing processless platemaking, in which an exposed printing plate precursor is fixed onto the plate cylinder of a printing press, and a fountain solution and ink are fed thereto while revolving the cylinder to remove non-image areas. This technique allows an exposed printing plate precursor to be mounted on a press and be made into a printing plate on an ordinary printing line.

A lithographic printing plate precursor fit for the onpress development system is required to have a photosensitive layer soluble in a fountain solution or an ink solvent and to have daylight handling properties for onpress development.

For example, Japanese Patent 2938397 discloses a lithographic printing plate precursor having, on a water-wettable support, a photosensitive layer made of thermoplastic hydrophobic polymer fine particles dispersed in a hydrophilic binder resin. According to the teachings, the precursor is exposed to an infrared laser beam to thermally bind the thermoplastic hydrophobic polymer particles to form an image, fixed to the cylinder of a printing press, and onpress developed with a fountain solution and/or ink.

Although this imaging method simply relying on thermal binding of hydrophobic particles achieves satisfactory onpress developability, the resulting printing plate has an insufficient press life because of the small image film strength. Where a heat-sensitive layer (image-forming layer) is provided directly on an aluminum support, the heat generated is dissipated through the aluminum support so that the particles are not bound in the support/heat-sensitive layer interface, which results in an insufficient press life.

JP-A-9-127683 (The term "JP-A" as used herein means an "unexamined published Japanese patent application"), JP-A-9-123387, JP-A-9-123388, JP-A-9-131850, and WO99/10186 also propose onpress platemaking after thermally binding thermoplastic fine particles. These methods cannot get rid of the problem of insufficient press life on account of weak image strength, either.

SUMMARY OF THE INVENTION

An object of the present invention is to provide a lithographic printing plate precursor which, after imaging, is fitted to a printing press and used to carry out printing without requiring development, which has high sensitivity and a satisfactory press life and is capable of producing printed matter free from residual colors and stains.

Another object of the invention is to provide a lithographic printing plate precursor which is capable of direct imaging of digital image data particularly by use of a solid state laser, a semiconductor laser, etc. which irradiate infrared rays.

As a result of extensive investigations, the present inventors have found that the above objects are accomplished by a lithographic printing plate precursor comprising a support having a water-wettable surface and a heat-sensitive layer provided thereon, wherein the heat-sensitive layer comprises a resin having a hydrogen-donating group and a resin having a hydrogen-accepting group, at least one of, preferably both of, the resins being finely particulate.

The hydrogen-donating group is preferably selected from a hydroxyl group, a carboxyl group, and a nitrogen atom having a hydrogen atom, and the hydrogen-accepting group is preferably selected from a carbonyl group, an ether group, and a nitrogen atom that does not have a hydrogen atom.

The heat-sensitive layer containing a resin having a hydrogen-donating group and a resin having a hydrogen-accepting group at least one which is finely particulate is easily removable from the support with water and/or ink. That is, unexposed, i.e., intact areas of the precursor is removed from the support with water and/or ink. On the other hand, the particles in exposed areas are melted by the photothermally generated heat. It follows that the resin having a hydrogen-donating group and the resin having a hydrogen-accepting group are brought into contact to form a hydrogen bond between the hydrogen-donating group and the hydrogen-accepting group thereby forming a firm film of hydrogen-bonding polymer complex. Therefore, the exposed areas remain on the plate to form image areas with a satisfactory press life.

The lithographic printing plate precursor of the invention is capable of imaging with reduced exposure energy. It enables direct platemaking from digital data from a computer, etc. by the use of a solid state laser or a semiconductor laser emitting infrared rays to provide a lithographic printing plate having a satisfactory press life and causing no stains.

DETAILED DESCRIPTION OF THE INVENTION

The lithographic printing plate precursor of the present invention comprises a support having a water-wettable surface and a heat-sensitive layer provided thereon, wherein the heat-sensitive layer (also called an image-forming layer) comprises a resin having a hydrogen-donating group (hereinafter referred to as a resin A) and a resin having a hydrogen-accepting group (hereinafter referred to as a resin B), at least one of the resins A and B being finely particulate.

The resin A is a resin having a functional group capable of donating hydrogen to form hydrogen bonds. While any resins having such a functional group are usable, those having a hydrogen-donating group selected from a hydroxyl group, a carboxyl group and a nitrogen atom having a hydrogen atom are preferred.

Resins A can be prepared either by starting with a monomer having the functional group or by introducing the functional group into a polymer through a polymer reaction. In using a resin A in the form of fine particles, a particulate resin A is prepared by emulsion polymerization or suspension polymerization of a monomer having the functional group. It can also be prepared by dissolving a polymer having the functional group in an organic solvent, emulsifying or dispersing the polymer solution in the presence of an emulsifier or a dispersant, and removing the organic solvent by evaporation.

Monomers having a hydrogen-donating group or a functional group that can be led to a hydrogen-donating group, which can be used to synthesize the resin A, include, but are not limited to, acetoxystyrene, butyloxystyrene, methoxymethyloxystyrene, phenol, cresol, vinyl acetate, acrylic acid, methacrylic acid, itaconic acid, crotonic acid, maleic acid, fumaric acid, vinylbenzoic acid, allylamine, allylaniline, N-vinylaniline, acetylaminostyrene, t-butyloxycarbonylaminomethylstyrene, N-vinylacetamide, acrylamide, methacrylamide, vinylbenzoic acid amide, N-methylacrylamide, and N-ethylmethacrylamide.

The resin A may be either a homopolymer of the above-recited monomer having a hydrogen-donating group or a functional group that can be led to a hydrogen-donating group or a copolymer comprising two or more of these monomers. In order to control the melting temperature, film-forming properties and the like of the resin A, a component having no hydrogen-donating group may be incorporated as a comonomer. Examples of such a comonomer include, but are not limited to, styrene, methylstyrene, t-butylstyrene, dimethylstyrene, trimethylstyrene, stilbene, vinylnaphthalene, vinylanthracene, fluorostyrene, chlorostyrene, bromostyrene, vinylbenzyl chloride, difluorostyrene, dichlorostyrene, pentafluorostyrene, trifluoromethylstyrene, ethylene, butadiene, isoprene, and piperylene.

The copolymer resin A preferably contains at least 5 mol %, particularly 10 mol % or more, of the monomer having a hydrogen-donating group or a functional group that can be led to a hydrogen-donating group. A content of 5 mol % or more is sufficient to form a sufficient amount of hydrogen bonds to bring about an improved press life.

The resin A preferably has a weight average molecular weight more than 2,000, particularly 5,000 to 1,000,000, and a number average molecular weight of more than 800, particularly 1,000 to 1,000,000. The resin A preferably has a degree of polydispersion of 1 or more, particularly 1.1 to 10.

Specific but non-limiting examples of the resin A are listed below.

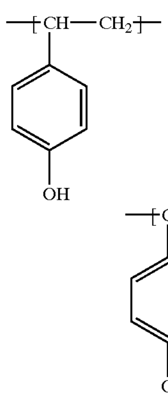

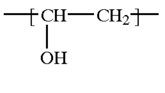

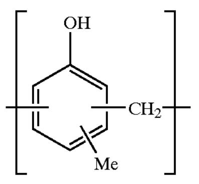

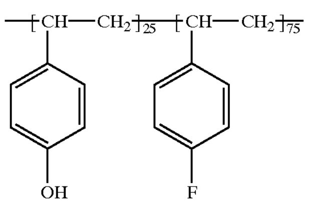

-continued

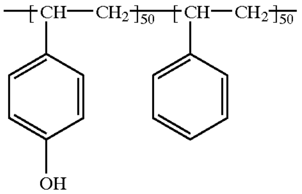

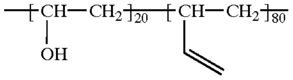

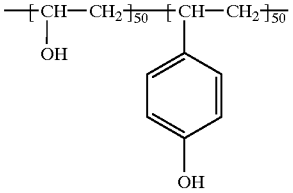

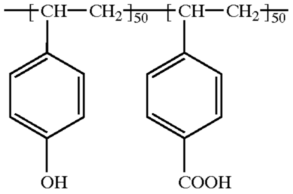

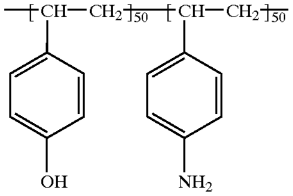

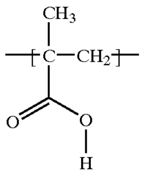

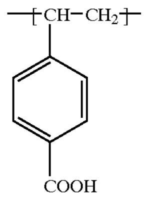

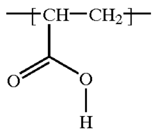

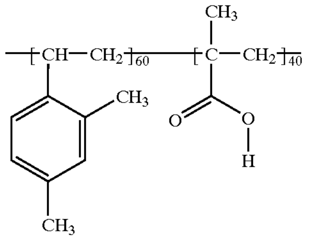

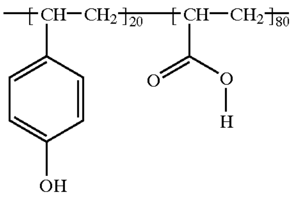

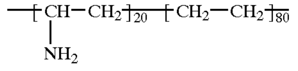

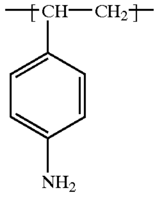

-continued

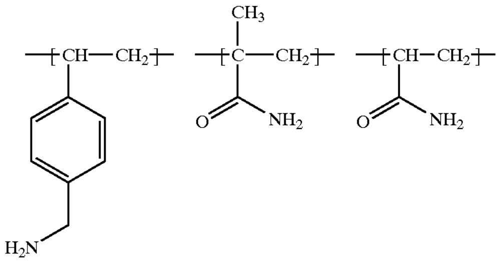

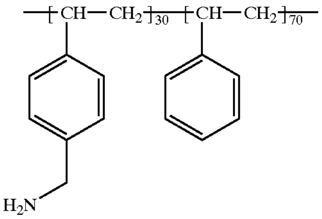

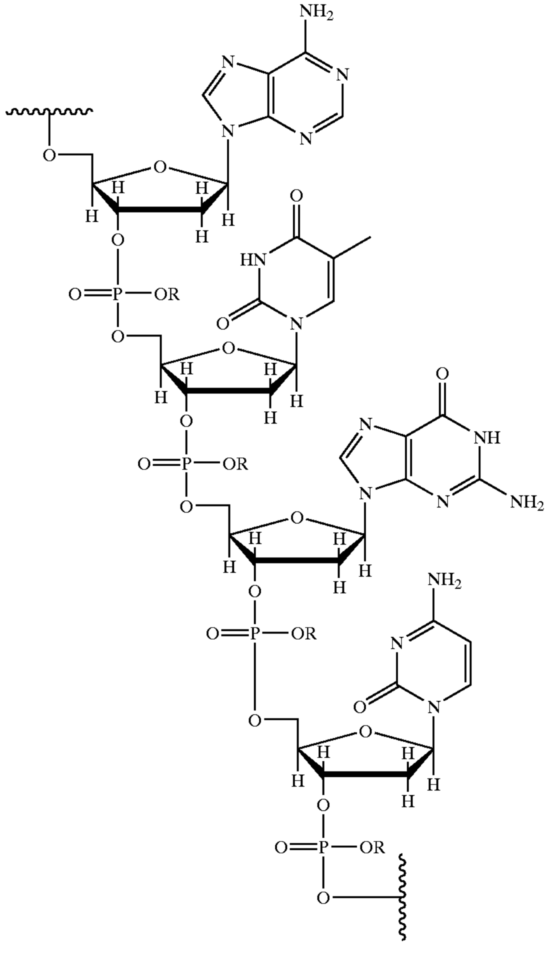

-continued

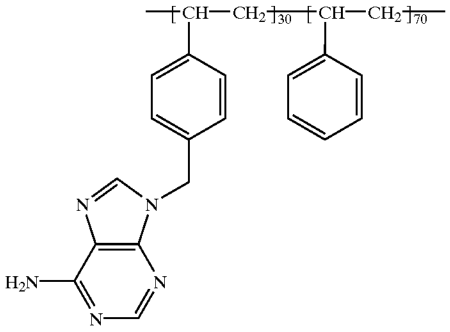

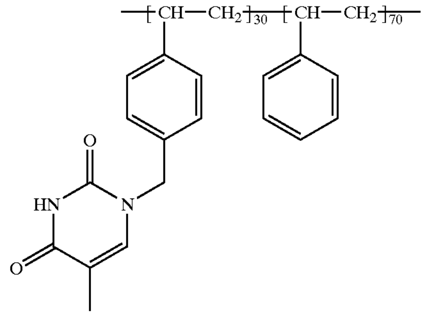

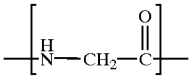

When the resin A is used as fine particles, it is preferred for the particles to have a melting point of 70° C. or higher, particularly 80° C. or higher, so as to maintain stability with time against softening during storage. The upper limit of the melting point, while not particularly limited, is preferably 300° C. from the standpoint of sensitivity.

The particles preferably have an average particle size of 0.01 to 20 μm, particularly 0.05 to 10 μm. An average particle size of 0.01 μm or greater assures satisfactory onpress developability. An average particle size of 20 μm or smaller secures satisfactory press life and resolution.

The resin B is a resin having a functional group capable of accepting hydrogen in forming hydrogen bonds. While any resins having such a functional group are usable, those having a hydrogen-accepting group selected from a carbonyl group, an ether group and a nitrogen atom that does not have a hydrogen atom are preferred.

Resins B can be prepared either by starting with a monomer having the functional group or by introducing the functional group into a polymer through a polymer reaction. In using a resin B in the form of fine particles, a particulate resin B is prepared by emulsion polymerization or suspension polymerization of a monomer having the functional group. It can also be prepared by dissolving a polymer having the functional group in an organic solvent, emulsifying or dispersing the polymer solution in the presence of an emulsifier or a dispersant, and removing the organic solvent by evaporation.

Monomers having a hydrogen-accepting group or a functional group that can be led to a hydrogen-accepting group, which can be used to synthesize the resin B, include, but are not limited to, unsaturated carboxylic acid esters, such as methyl (meth)acrylate, ethyl (meth)acrylate, propyl (meth) acrylate, isopropyl (meth)acrylate, n-butyl (meth)acrylate, isobutyl (meth)acrylate, sec-butyl (meth) acrylate, t-butyl (meth) acrylate, and dimethyl maleate; unsaturated carboxylic acid amides, such as N,N-dimethyl(meth)acrylamide, (meth)acrylamide, and N-isopropyl(meth)acrylamide; vinylpyridine, ethylene oxide, propylene oxide, ethylene glycol, propylene glycol, methyl vinyl ketone, (meth) acrolein, methoxystyrene, poly(ethyloxy)methylstyrene, 2-dimethylaminoethyl (meth)acrylate, 2-adenylethyl (meth) acrylate, N-vinylacetamide, and vinyl acetate.

The resin B may be either a homopolymer of the above-recited monomer having a hydrogen-accepting group or a functional group that can be led to a hydrogen-accepting group or a copolymer comprising two or more of these monomers. In order to control the melting temperature, film-forming properties and the like of the resin B, a component having no hydrogen-accepting group may be incorporated as a comonomer. Examples of such a comonomer include, but are not limited to, styrene, methylstyrene, t-butylstyrene, dimethylstyrene, trimethylstyrene, stilbene, vinylnaphthalene, vinylanthracene, fluorostyrene, chlorostyrene, bromostyrene, vinylbenzyl chloride, difluorostyrene, dichlorostyrene, pentafluorostyrene, trifluoromethylstyrene, ethylene, butadiene, isoprene, and piperylene.

The copolymer resin B preferably contains at least 5 mol %, particularly 10 mol % or more, of the monomer having a hydrogen-accepting group or a functional group that can be led to a hydrogen-accepting group. A content of 5 mol % or more is sufficient to form a sufficient amount of hydrogen bonds to bring about an improved press life.

The resin B preferably has a weight average molecular weight more than 2,000, particularly 5,000 to 1,000,000, and a number average molecular weight of more than 800, particularly 1,000 to 1,000,000. The resin B preferably has a degree of polydispersion of 1 or more, particularly 1.1 to 10.

Specific but non-limiting examples of the resin B are shown below.

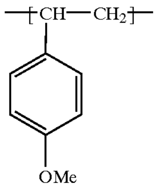
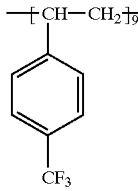
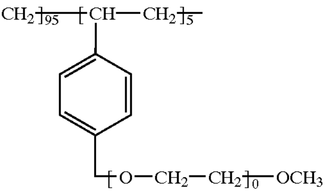
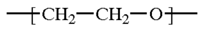
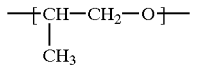
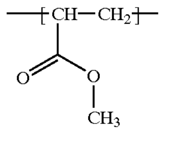

-continued

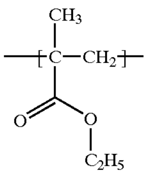
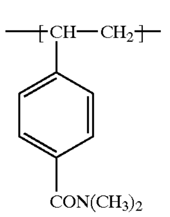
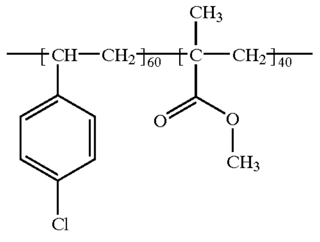
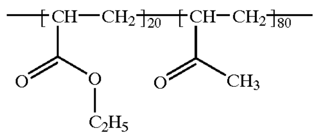
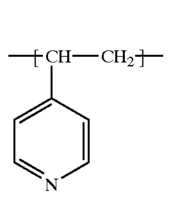
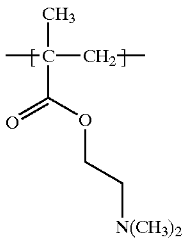
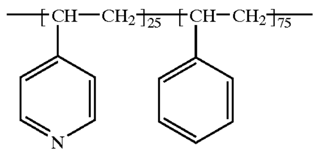
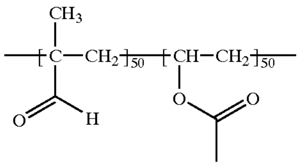
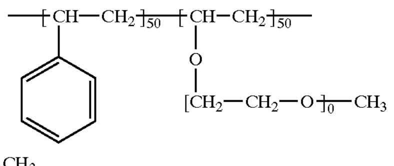
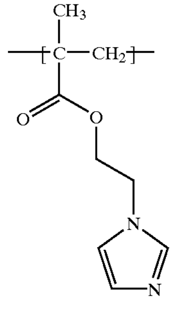
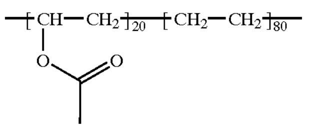

-continued

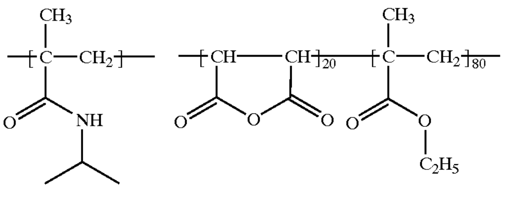

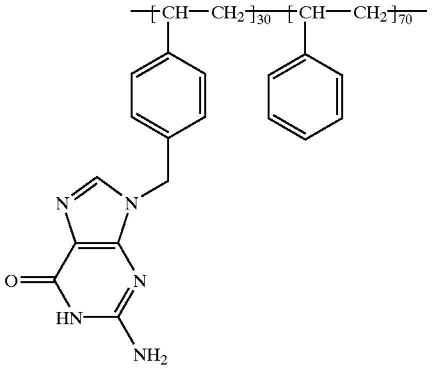

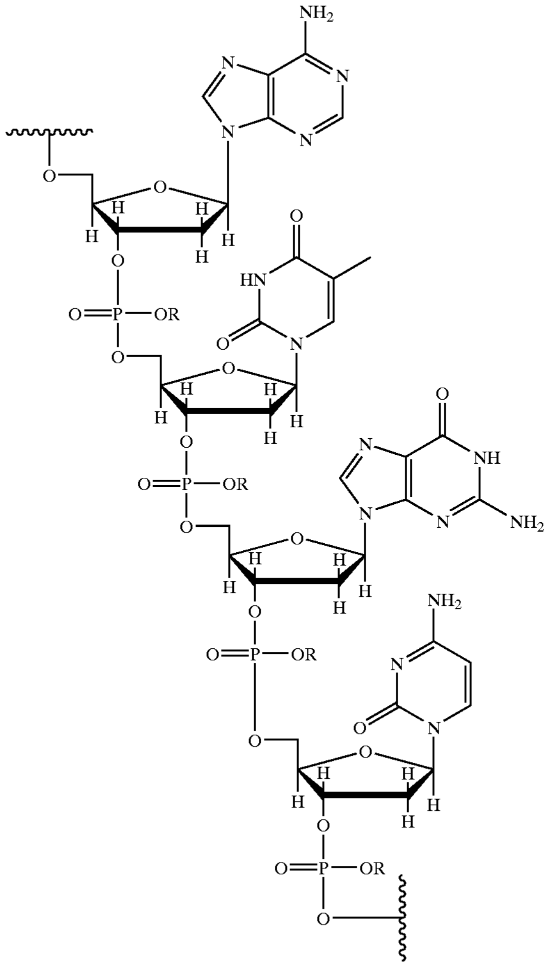

-continued

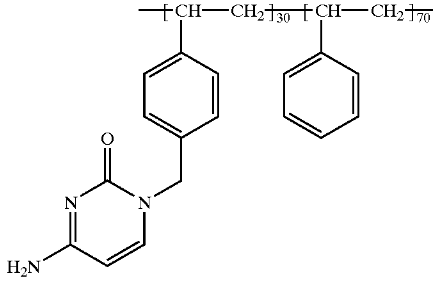

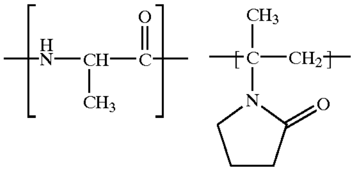

Where the resin B is used as fine particles, it is preferred for the particles to have a melting point of 70° C. or higher, particularly 80° C. or higher, so as to maintain stability with time against softening during storage. The upper limit of the melting point, while not particularly limited, is preferably 300° C. from the standpoint of sensitivity.

The particles preferably have an average particle size of 0.01 to 20 $\mu$m, particularly 0.05 to 10 $\mu$m. An average particle size of 0.01 $\mu$m or greater assures satisfactory onpress developability. An average particle size of 20 $\mu$m or smaller secures satisfactory press life and resolution.

The heat-sensitive layer preferably contains the resins A and B in a total amount of 50% by weight or more, particularly 60% by weight or more, based on the total solids content of the layer so as to secure satisfactory press life and resolution.

The mixing ratio of the resins A and B in the heat-sensitive layer is arbitrarily selected but is preferably such that the number of the monomer units carrying the hydrogen bond-forming functional groups (i.e., the hydrogen-accepting group and the hydrogen-donating group) is 5% or more of the total monomer units of the resins A and B so as to form sufficient hydrogen bonds for a press life.

Components constituting the heat-sensitive layer other than the resins A and B will then be described.

The lithographic printing plate precursor contains a photothermal material that generates heat on irradiation in at least one of the heat-sensitive layer and a layer adjacent thereto to carry out imaging on irradiation with laser light. Where the photothermal material is incorporated into an adjacent layer, it is preferably incorporated into an overcoating layer described later. Where it is incorporated into the heat-sensitive layer, it is preferably added into the fine particles to effectively induce melting and thermal reaction of the particles.

Any substance absorbing light having wavelengths of 700 nm or longer can be used as a photothermal material. Such substances include various pigments and dyes and metal particles.

Useful pigments include commercially available ones and those described in literature, such as Color Index, *Saishin*

*Ganryo Binran*, Nippon Ganryo Gijutsu Kyokai (ed.) (1977), *Saishin Ganryo Ohyo Gijutsu,* CMC Shuppan (1986), and *Insatsu Ink Gijutsu*, CMC Shuppan (1984).

The pigments include black pigments, brown pigments, red pigments, purple pigments, blue pigments, green pigments, fluorescent pigments, metal powder pigments, and polymeric pigments. More specifically, the pigments include insoluble azo pigments, azo lake pigments, condensed azo pigments, chelate azo pigments, phthalocyanine pigments, anthraquinone pigments, perylene pigments, perinone pigments, thioindigo pigments, quinophthalone pigments, dioxadine pigments, isoindolidone pigments, quinophthalone pigments, dyed lake pigments, azine pigments, nitroso pigments, natural pigments, fluorescent pigments, inorganic pigments, and carbon black.

The pigments can be used with or without a surface treatment. Conceivable surface treatments include coating with a hydrophilic or lipophilic resin, adhering a surface active agent, and chemically bonding are active substance (e.g., silicasol, aluminasol, silane coupling agents, epoxy compounds, isocyanate compounds). For the details, refer to *Kinzokusekken no Seisitsu to Ohyo,* Saiwai Shobo, *Insatsu Ink Gijutsu,* CMC Shuppan (1984), and *Saishin Ganryo Ohyo Gijutsu,* CMC Shuppan (1986). Of the usable pigments preferred are those absorbing infrared or near-infrared light for being fit for lasers emitting infrared or near-infrared light. Carbon black is a preferred choice. Carbon black coated with a hydrophilic resin or silica sol so as to be readily dispersed in water-soluble or hydrophilic resins or to keep satisfactory water wettability is particularly preferred.

The pigment preferably has a particle size of 0.01 to 1 $\mu$m, particularly 0.01 to 0.5 $\mu$m.

Dyes which can be used include commercially available ones and those described in literature, e.g., *Senryo Binran,* Society of Synthetic Organic Chemistry, Japan (1970). Examples include azo dyes, metal complex azo dyes, pyrazolone azo dyes, anthraquinone dyes, phthalocyanine dyes, carbonium dyes, quinone imine dyes, methine dyes, and cyanine dyes. Preferred of them are those absorbing infrared or near-infrared light for the same reason described above.

Dyes absorbing infrared or near-infrared light include the cyanine dyes described in JP-A-58-125246, JP-A-59-84356, JP-A-60-78787, U.S. Pat. No. 4,973,572, and JP-A-10-268512, the methine dyes described in JP-A-58-173696, JP-A-58-181690, and JP-A-58-194595, the naphthoquinone dyes described in JP-A-58-112793, JP-A-58-224793, JP-A-59-48187, JP-A-59-73996, JP-A-60-52940, and JP-A-60-63744, the squarylium dyes described in JP-A-58-112792, the cyanine dyes described in British Patent 434,875, the dyes described in U.S. Pat. No. 4,756,993, the cyanine dyes described in U.S. Pat. No. 4,973,572, and the dyes described in JP-A-10-268512.

The near-infrared absorbing sensitizers described in U.S. Pat. No. 5,156,938 are also useful. Particularly suitable dyes are the substituted arylbenzo (thio) pyrylium salts described in U.S. Pat. No. 3,881,924, the trimethinethiapyrylium salts described in U.S. Pat. No. 4,327,169 (JP-A-57-142645), the pyrylium compounds described in JP-A-58-181051, JP-A-58-220143, JP-A-59-41363, JP-A-59-84248, JP-A-59-84249, JP-A-59-146063, and JP-A-59-146061, the cyanine dyes described in JP-A-59-216146, the pentamethinethiopyrylium salts described in U.S. Pat. No. 4,283,475, the pyrylium compounds described in JP-B-5-13514 (the term "JP-B" as used herein means an "examined Japanese patent publication") and JP-B-5-19702, and Epolight III-178, III-130 and III-125 available from Epolin Inc. Particularly preferred of these dyes are water-soluble cyanine dyes. Specific examples of the dyes are listed below.

(I-1)

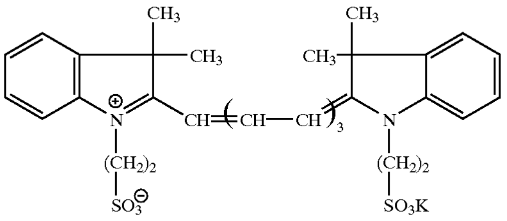

(I-2)

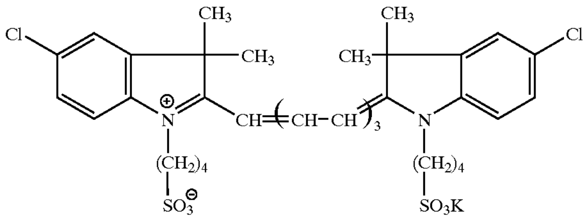

(I-3)

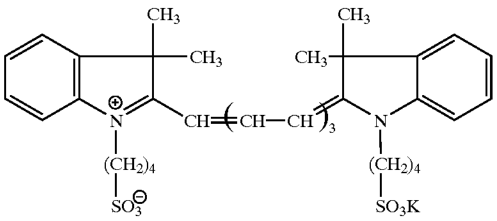

(I-4)

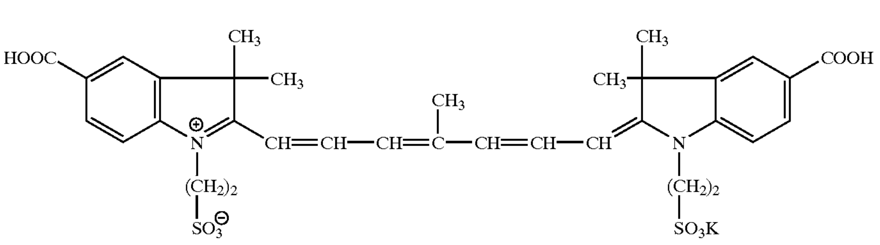

-continued
(I-5)
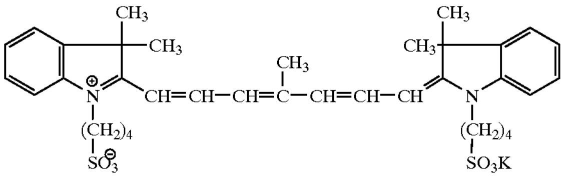
(I-6)
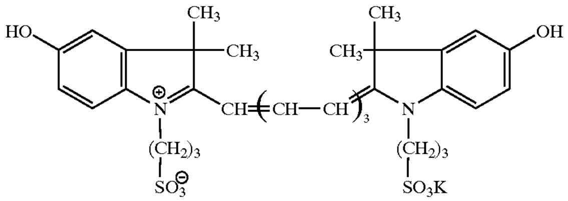
(I-7)
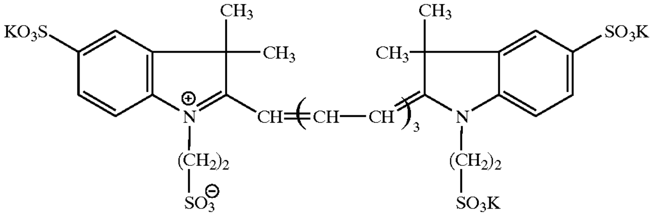
(I-8)
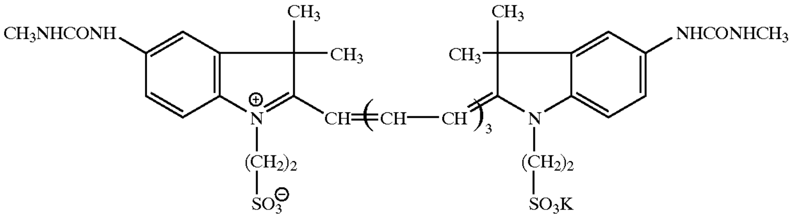
(I-9)
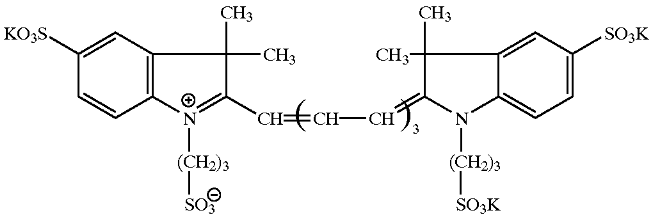
(I-10)
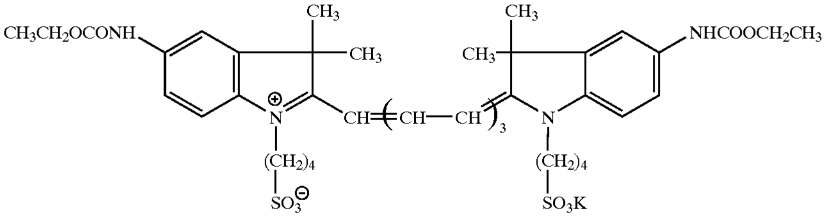
(I-11)
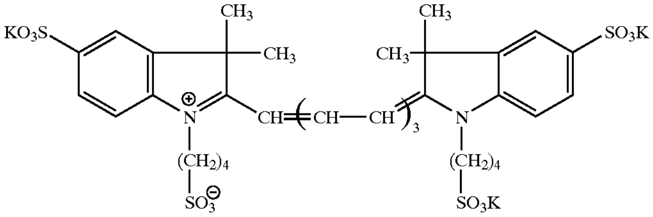
(I-12)
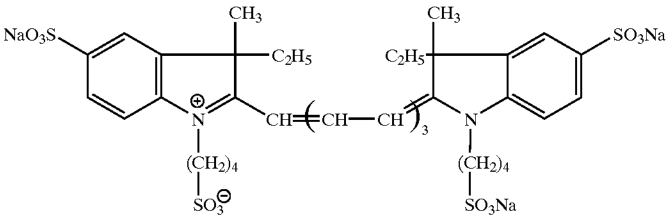

-continued
(I-13)
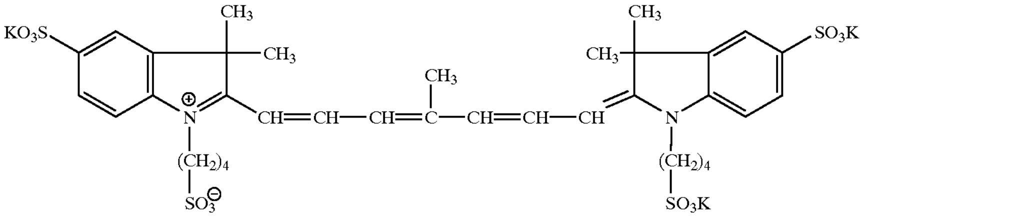
(I-14)
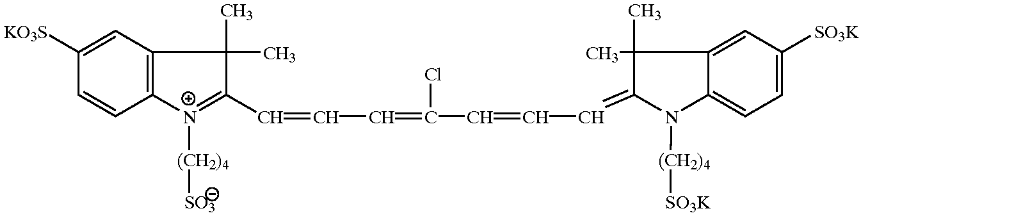
(I-15)
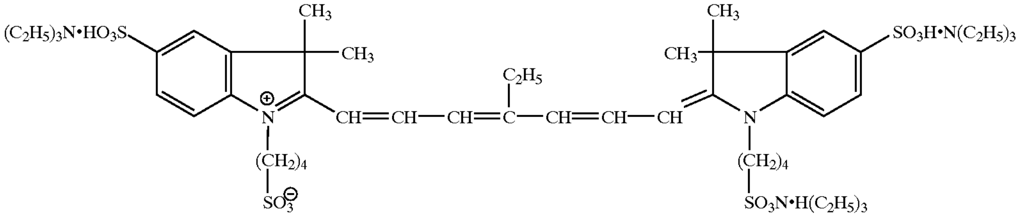
(I-16)
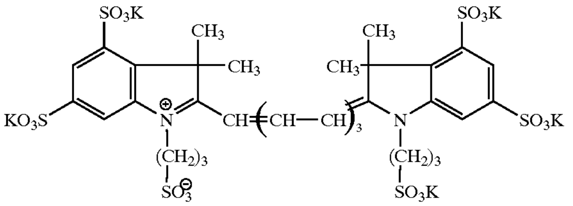
(I-17)
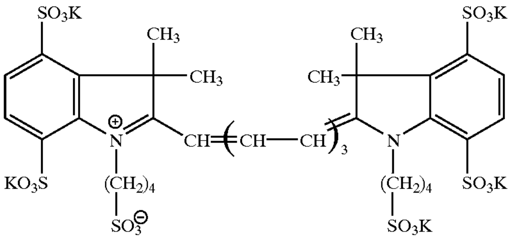
(I-18)
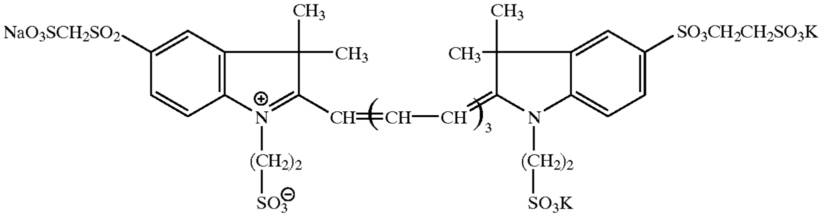
(I-19)
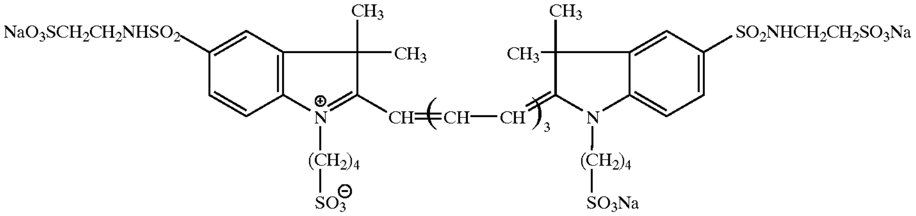
(I-20)
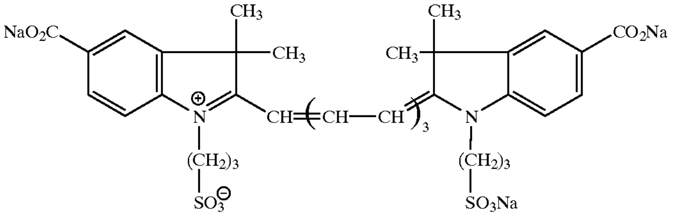

-continued
(I-21)
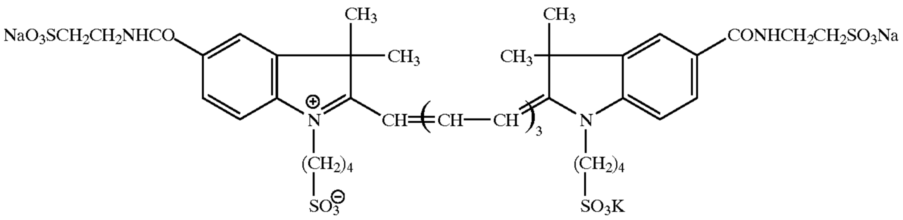
(I-22)
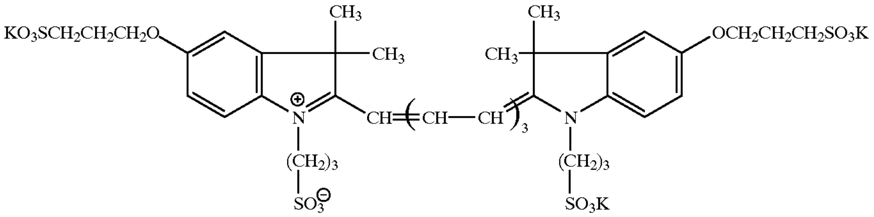
(I-23)
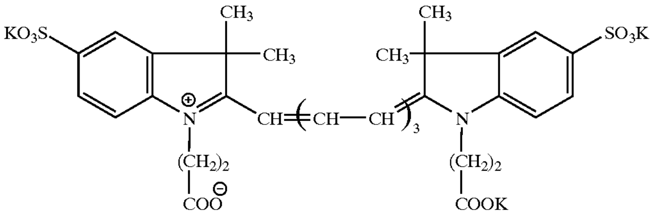
(I-24)
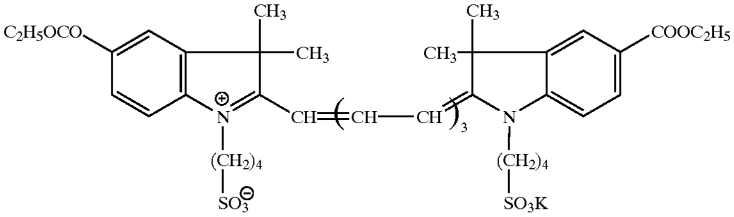
(I-25)
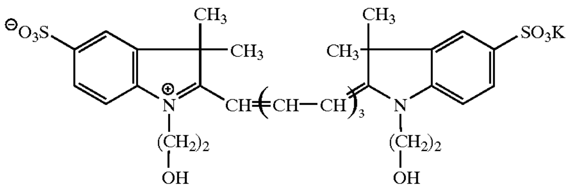
(I-26)
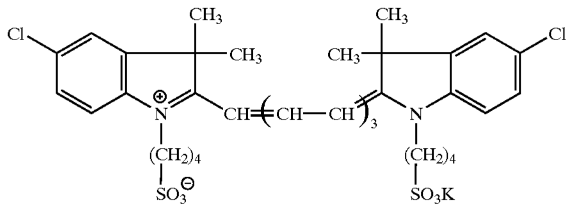
(I-27)
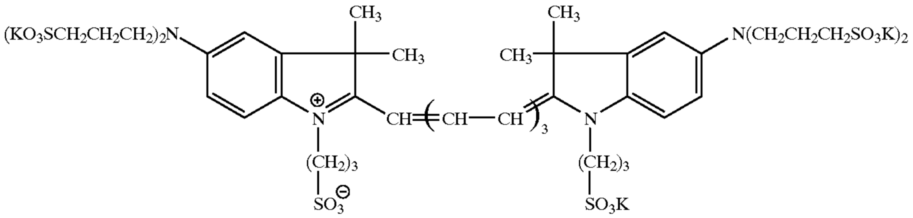
(I-28)
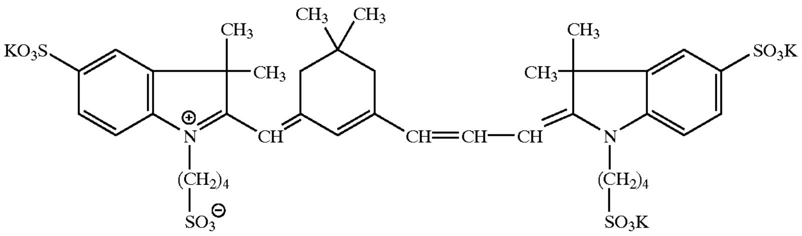

-continued (I-29)

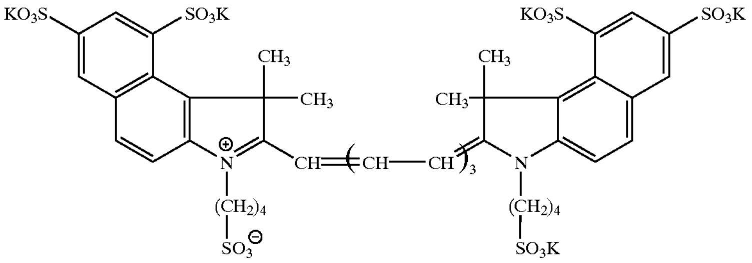

(I-30)

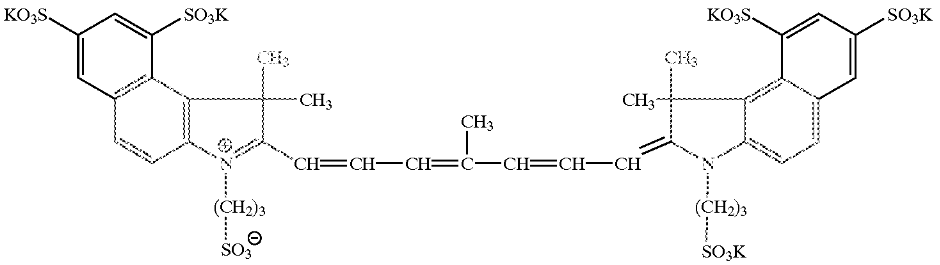

(I-31)

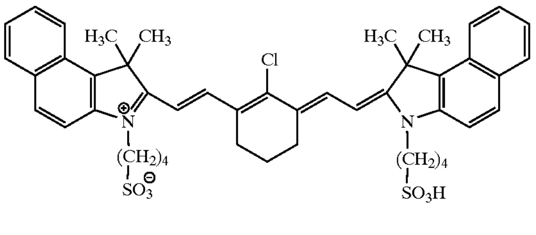

(I-32)

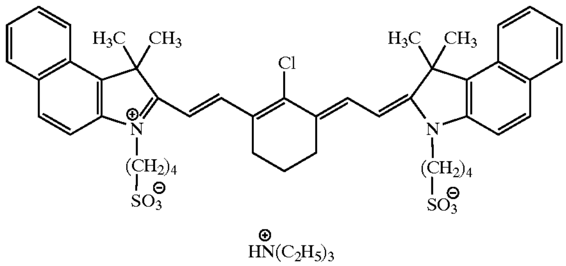

(I-33)

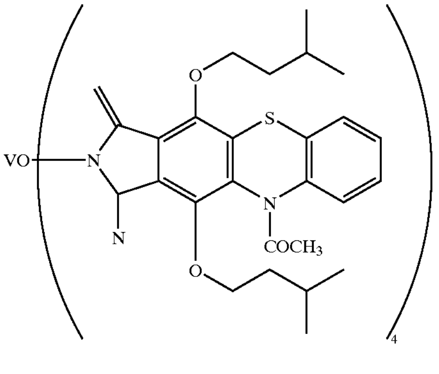

While metal particles of any kind can be used as a photothermal material as long as they are thermally fused together on irradiation through photothermal conversion, preferred metals include metals and alloys of metals belonging to the groups 8 and 1B of the Periodic Table, particularly Ag, Au, Cu, Pt, Pd and their alloys.

Metal colloidal particles are prepared by adding an aqueous solution of a salt or a complex salt of the metal to an aqueous solution of a dispersion stabilizer, adding a reducing agent to the mixture to form a metal colloid, and removing unnecessary salts.

The dispersion stabilizer includes carboxylic acids such as citric acid and oxalic acid and polymers such as polyvinylpyrrolidone (PVP), polyvinyl alcohol (PVA), gelatin, and acrylic resins. The reducing agent includes base metal salts such as $FeSO_4$ and $SnSO_4$, boron hydride compounds, formalin, dextrin, glucose, sodium potassium tartrate, tartaric acid, sodium thiosulfate, and hypophosphites.

The metal colloidal particles usually have an average particle size of 1 to 500 nm, preferably 1 to 100 nm, still preferably 1 to 50 nm. The colloid may be polydisperse but is preferably monodisperse having a variation coefficient of 30% or less. The salt removal is carried out by, for example, ultrafiltration or sedimentation, either spontaneous or centrifugal, by addition of methanol/water or ethanol/water to the disperse system followed by discarding the supernatant liquid.

Where incorporated into the image-forming layer (heat-sensitive layer), the organic photothermal material is added in an amount up to 30% by weight, preferably 5 to 25% by weight, still preferably 7 to 20% by weight, based on the total solids content of the layer, and the inorganic photothermal material is added in an amount of 5% by weight or more, preferably 10% by weight or more, still preferably 20% by weight or more, based on the total solids content of the layer. A content of the inorganic photothermal material of less than 5% results in reduced sensitivity.

The heat-sensitive layer can further contain a hydrophilic resin to improve onpress developability and film strength. Besides, a hydrophilic resin added to the heat-sensitive layer can be cured by crosslinking to provide a processless printing plate precursor.

Hydrophilic resins which are preferably used in the heat-sensitive layer include resins having a hydrophilic group, such as hydroxyl, carboxyl, hydroxyethyl, hydroxypropyl, amino, aminoethyl, aminopropyl or carboxymethyl, and hydrophilic sol-gel converting binder resins. Specific examples of suitable hydrophilic resins are gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homo- and copolymers of hydroxyethyl methacrylate, homo- and copolymers of hydroxyethyl acrylate, homo- and copolymers of hydroxypropyl methacrylate, homo- and copolymers of hydroxypropyl acrylate, homo- and copolymers of hydroxybutyl methacrylate, homo- and copolymers of hydroxybutyl acrylate, polyethylene glycols, hydroxypropylene polymers, PVA, partially hydrolyzed polyvinyl acetate (degree of hydrolysis: 60% or more, preferably 80% or more, by weight), polyvinyl formal, polyvinyl butyral, PVP, homo- and copolymers of acrylamide, homo- and copolymers of methacrylamide, and homo- and copolymers of N-methylolacrylamide.

The hydrophilic resin may be used as cured by crosslinking. Useful crosslinking agents include aldehyde compounds, such as glyoxal, melamine formaldehyde resins and urea formaldehyde resins; methylol compounds, such as N-methylolurea, N-methylolmelamine, and N-methylol polyamide; active vinyl compounds, such as divinylsulfone and bis(β-hydroxyethylsulfonic acid); epoxy compounds, such as epichlorohydrin, polyethylene glycol diglycidyl ether, polyamide-polyamine epichlorohydrin adducts, and polyamide epichlorohydrin resins; esters, such as monochloroaceticesters and thioglycolic esters; carboxylic acid polymers, such as polyacrylic acid and methyl vinyl ether/maleic acid copolymers; inorganic crosslinking agents, such as boric acid, titanyl sulfate, Cu salts, Al salts, Sn salts, V salts and Cr salts; and modified polyamide-polyimide resins.

The hydrophilic resin can be added to the image-forming layer (heat-sensitive layer) in an amount up to 40% by weight based on the total solids content of the layer. A crosslinking catalyst, such as ammonium chloride, silane coupling agents, and titanate coupling agents, can be used in combination.

The image-forming layer (heat-sensitive layer) can further contain a dye having a large absorption in the visible light region as an image coloring agent so that image areas may be easily distinguishable from non-image areas after image formation. Examples of dyes suitable for this purpose are Oil Yellow #101, Oil Yellow #103, Oil Pink #312, Oil Green BG, Oil Blue BOS, Oil Blue #603, Oil Black BY, Oil Black BS, Oil Black T-505 (all available from Orient Chemical Industries, Ltd.); Victoria Pure Blue, Crystal Violet (C.I. 42555), Methyl Violet (C.I. 42535), Ethyl Violet, Rhodamine B (C.I. 145170B), Malachite Green (C.I. 42000), Methylene Blue (C.I. 52015); and the dyes described in JP-A-62-293247. Pigments such as phthalocyanine pigments, azo pigments and titanium dioxide are also suitable. These coloring agents can be added to a coating composition for forming the heat-sensitive layer in an amount up to 10% by weight based on the total solids content of the composition.

If desired, the image-forming layer (heat-sensitive layer) can furthermore contain a plasticizer for imparting flexibility to the coating film. Useful plasticizers include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate. The plasticizer can be added in an amount up to 10% by weight based on the total solids content of the layer.

The heat-sensitive layer is formed by coating a support (hereinafter described) with a coating composition prepared by dissolving the above-described components in a solvent. Suitable solvents include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, and water. These solvents can be used either individually or as a mixture thereof. The solvent is preferably used in an amount to give a solids concentration of 1 to 50% by weight.

While varying depending on the use, the coating composition is applied preferably to a dry coating weight of 0.5 to 5.0 g/m$^2$. A smaller coating weight, while giving increased apparent sensitivity, tends to result in insufficient film properties for the imaging function. The coating composition is applied by various methods, such as bar coating, spin coating, spray coating, curtain coating, dip coating, air knife coating, blade coating, roll coating, and the like.

The coating composition may contain a surface active agent for improving coating properties, such as the fluorine surface active agents described in JP-A-62-170950. A preferred amount of the surface active agent to be added is 0.01 to 1% by weight, particularly 0.05 to 0.5% by weight, based on the total solids content of the heat-sensitive layer.

The printing plate precursor of the invention can have an overcoating layer mainly comprising a water-soluble resin on the heat-sensitive layer for the purpose of protecting the heat-sensitive layer against contamination, scratches or ablation. Any water-soluble organic polymers are usable, but solubilized cellulose derivatives are preferred. Suitable solubilized cellulose derivatives include carboxymethyl cellulose (e.g., Cellogen 5A), carboxyethyl cellulose, methyl cellulose (e.g., Tylose MH200K), hydroxyethyl cellulose, hydroxypropyl cellulose (e.g., Metholose 50), sulfated cellulose, and modified products derived from these cellulose derivatives. Carboxymethyl cellulose is particularly preferred. The degree of substitution of the three hydroxyl groups per 6-membered ring of cellulose is preferably 0.5 to 3.0, still preferably 0.6 to 2.5. The proportion of the water-soluble resin in the overcoating layer is at least 40%, preferably 60% or more, still preferably 80% or more, by weight. A proportion less than 40% results in poor adhesion of ink.

The overcoating layer can contain another kind of a water-soluble resin for improving developability. Water-soluble resins for this purpose include hydrolyzed polyvinyl acetate (degree of hydrolysis: 65% or more), polyacrylic acid and its alkali metal salts or amine salts, acrylic acid copolymers and their alkali metal salts or amine salts, polymethacrylic acid and its alkali metal salts or amine salts, methacrylic acid copolymers and their alkali metal salts or amines salts, homo- and copolyacrylamide, polyhydroxyethyl acrylate, homo- and copolyvinylpyrrolidone, polyvinyl methyl ether, polyvinyl methyl ether/maleic anhydride copolymers, homo- or copoly (2-acrylamide-2-methyl-1-propanesulfonic acid) and its alkali metal salts or amine salts, gum arabic, white dextrin, pullulan, and ethers of enzymatically prepared dextrin. The water-soluble resin of this kind is added in an amount less than 40% by weight based on the over coating layer. Addition of 40% or more of the water-soluble resin results in poor adhesion of ink. A preferred amount is less than 30% by weight, particularly less than 20% by weight.

The overcoating layer can contain a fluorine compound, a silicone compound or a wax emulsion to prevent stickiness. These compounds bleed on the surface to prevent stickiness attributed to the hydrophilicity of the resin. These compounds can be added in an amount of 0.1 to 5% by weight, preferably 0.5 to 2.0% by weight, based on the layer.

As mentioned previously, it is a preferred embodiment to incorporate a water-soluble photothermal material selected from the above-recited photothermal materials. Where the overcoating layer is formed by application of an aqueous solution, the coating solution can contain a nonionic surface active agent, such as polyoxyethylene nonylphenol and polyoxyethylene dodecyl ether, to improve coating uniformity. The coating weight of the overcoating layer is preferably 0.1 to 2.0 g/$m^2$, still preferably 0.5 to 1.2 g/$m^2$. A thinner overcoating layer is easily stained with fingerprints. A larger coating weight results in deterioration of onpress developability.

The support on which the heat-sensitive layer (image-forming layer) is provided is water-wettable (hydrophilic) sheeting having dimensional stability. Specific examples of supports are paper, plastic-laminated paper (e.g., paper laminated with a polyethylene, polypropylene or polystyrene), a metal plate (e.g., of aluminum, zinc, zinc or copper), a plastic film (e.g., of cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal), and paper or a plastic film laminated with or deposited with the above-recited metal. Preferred of them are a polyester film and an aluminum plate.

It is particularly preferred to use as a support an aluminum plate, which is light, easy to surface-treat, and excellent in work ability and anticorrosion. Aluminum materials fit for the use include JIS 1050, JIS 1100, JIS 1070, Al—Mg alloys, Al—Mn alloys, Al—Mn—Mg alloys, Al—Zr alloys, and Al—Mg—Si alloys.

The following is a list of the literature furnishing the techniques pertaining to aluminum materials useful as a support.

(1) JIS 1050 material: JP-A-59-153861, JP-A-61-51395, JP-A-62-146694, JP-A-60-215725, JP-A-60-215726, JP-A-60-215727, JP-A-60-215728, JP-A-61-272357, JP-A-58-11759, JP-A-58-42493, JP-A-58-221254, JP-A-62-148295, JP-A-4-254545, JP-A-4-165041, JP-B-3-68939, JP-A-3-234594, JP-B-1-47545, JP-A-62-140894, JP-B-1-35910, and JP-B-55-28874.

(2) JIS 1070 material: JP-A-7-81264, JP-A-7-305133, JP-A-8-49034, JP-A-8-73974, JP-A-8-108659, and JP-A-8-92679.

(3) Al—Mg alloy: JP-B-62-5080, JP-B-63-60823, JP-B-3-61753, JP-A-60-203496, JP-A-60-203497, JP-B-3-11635, JP-A-61-274993, JP-A-62-23794, JP-A-63-47347, JP-A-63-47348, JP-A-63-47349, JP-A-64-61293, JP-A-63-135294, JP-A-63-87288, JP-B-4-73392, JP-B-7-100844, JP-A-62-149856, JP-B-4-73394, JP-A-62-181191, JP-B-5-76530, JP-A-63-30294, JP-B-6-37116, JP-A-2-215599, and JP-A-61-201747.

(4) Al—Mn alloy: JP-A-60-230951, JP-A-1-306288, JP-A-2-29318, JP-B-54-42284, JP-B-4-19290, JP-B-4-19291, JP-B-4-19292, JP-A-61-35995, JP-A-64-51992, U.S. Pat. No. 5,009,722 and 5,028,276, and JP-A-4-226394.

(5) Al—Mn alloy: JP-A-62-86143, JP-A-3-222796, JP-B-63-60824, JP-A-60-63346, JP-A-60-63347, EP 223737, JP-A-1-283350, U.S. Pat. No. 4,818,300, and Brazilian Patent 1222777.

(6) Al—Zr alloy: JP-B-63-15978, JP-A-61-51395, JP-A-63-143234, and JP-A-63-143235.

(7) Al—Mg—Si alloy: Brazilian Patent 1421710

The aluminum plate can be produced by casting a molten aluminum alloying composition. Before casting, the aluminum alloy melt is desirably subjected to cleaning for removing unnecessary gas (e.g., hydrogen) and foreign matter such as non-metallic inclusions and oxides to prevent defects caused by them. Cleaning treatments include fluxing, degassing using Ar gas, $Cl_2$ gas, etc., filtering with rigid media filters, such as a ceramic tube filter or a ceramic foam filter, filters using a bed of alumina flakes, alumina balls, etc., or glass cloth filters, and a combination of degassing and filtering.

Filtering techniques for aluminum cleaning are described in JP-A-6-57342, JP-A-3-162530, JP-A-5-140659, JP-A-4-231425, JP-A-4-276031, JP-A-5-311261, and JP-A-6-136466. Degassing techniques for aluminum cleaning are disclosed in JP-A-5-51659, JP-A-5-51660, JP-A-U-5-49148, and JP-A-7-40017.

Aluminum casting methods are divided into processes using a stationary mold which are represented by a direct chill (DC) casting process and processes using a driven mold which are represented by a continuous casting process. The cooling rate in DC casting is 1 to 300° C./sec. At a lower cooling rate, coarse intermetallic compounds are produced considerably.

Continuous casting processes that are industrially practiced include processes using cooling rolls, such as a Hunter process and a 3C process, and processes using cooling belts or cooling blocks, such as a Hazellett process, an Alusuisse Caster II process. The cooling rate in continuous casting is 100 to 1000° C./sec. Generally adopting a higher cooling rate than DC casting, continuous casting is characterized by providing an increased degree of solid solution of alloying components in the aluminum matrix. The present inventors have proposed preferred continuous casting processes in JP-A-3-9798, JP-A-5-201166, JP-A-5-156414, JP-A-6-262203, JP-A-6-122949, JP-A-6-210406, and JP-A-6-262308.

DC casting produces ingots having a thickness of 300 to 800 mm. The surface of the ingot is cut to a depth of 1 to 30 mm, preferably 1 to 10 mm. If necessary, the ingot is heat treated to equalize its temperature under conditions that do not allow intermetallic compounds to grow, i.e., 450 to 620° C. for 1 to 48 hours. Heat treatment shorter than 1 hour is insufficient for temperature equalization. The ingot is then hot-rolled and cold-rolled to obtain a rolled aluminum plate. The hot rolling initiating temperature is 350 to 500° C. Process annealing may be carried out before, after or in the course of cold rolling. Process annealing is conducted in a batch annealing furnace at 280 to 600° C. for 2 to 20 hours, preferably at 350 to 500° C. for 2 to 10 hours, or in a continuous annealing furnace at 400 to 600° C. for 360 seconds or shorter, preferably 450 to 550° C. for 120 seconds or shorter. Heating in a continuous annealing furnace at a rate of temperature rise of 10° C./sec or higher is also effective to make the crystal structure finer.

If necessary, the resulting aluminum plate having a prescribed thickness of 0.1 to 0.5 mm can be subjected to shape correcting to remove shape defects by means of a roller leveler, a tension leveler, etc. Shape correcting could be performed after cutting the rolled plate into sheets but, for productivity, is preferably conducted on a flat-rolled coil. The aluminum plate is usually passed through a slitter and slit into the necessary width. The slit edges have a shear surface or a rupture surface or both.

The thickness precision of the plate is preferably within ±10 $\mu$m, still preferably within ±6 $\mu$m, over the whole coil length. The thickness difference in the coil width direction is preferably within 6 $\mu$m, still preferably within 3 $\mu$m. The width precision is preferably within ±1.0 mm, still preferably within ±0.5 mm. The surface roughness of the rolled aluminum plate, which is largely dependent on the surface profile of the pressure roll, is preferably about 0.1 to 1.0 $\mu$m in terms of center-line surface roughness (Ra). Too large surface roughness of an aluminum support which has been transferred from the pressure roll will be perceived even after graining and formation of an image-forming layer, which gives poor outer appearance. To achieve an Ra smaller than about 0.1 $\mu$m, the surface of the pressure roll must be given a fine finish, which is industrially uneconomical.

In order to prevent scratches due to friction between aluminum plates, a thin oil film may be provided on the surface of the aluminum plate. The oil may be either volatile or non-volatile according to necessity. The amount of oil applied is 3 to 100 mg/m$^2$, desirably 50 mg/m$^2$ or less, more desirably 10 mg/m$^2$ or less. Application of too much oil may cause slip on the production line. With no oil applied, the plate in flat-roll coil receives scratches during transportation. With respect to cold rolling, reference can be made to JP-A-6-210308.

On the other hand, the continuous casting processes using cooling rolls, such as the Hunter process, directly produce a rolled plate having a thickness of 1 to 10 mm in a continuous manner without requiring hot rolling. The continuous casting processes using cooling belts, such as the Hazellett process, produce a 10 to 50 mm thick cast plate, which is hot rolled, usually immediately after casting, into a 1 to 10 mm thick rolled plate. The continuously cast and rolled plate is subjected to cold rolling, process annealing, shape correcting, and slitting similarly to the DC cast plate to obtain a 0.1 to 0.5 mm thick plate. The process annealing and cold rolling conditions for the continuously cast plate are described in JP-A-6-220593, JP-A-6-210308, JP-A-7-54111, and JP-A-8-92709.

The aluminum plate thus produced is subjected to various surface treatments, such as graining, anodizing for assuring scratch resistance, and treatments for enhancing water wettability, to be made into an aluminum support on which an image-forming layer can be provided.

Prior to graining, the aluminum plate may be degreased with a surface active agent, an organic solvent, an alkali aqueous solution, etc. to remove the rolling oil. Degreasing with an alkali can be followed by neutralization with an acidic solution and desmutting.

Graining, which is for improving adhesion to an image-forming layer and for imparting water receptivity, includes mechanical graining, chemical graining, electrochemical graining, and combinations thereof. Mechanical graining includes sand blasting, ball graining, wire graining, brushing with a nylon brush and an aqueous slurry of abrasive grains, and liquid horning (beating with an aqueous slurry of abrasive grains). Chemical graining is etching with an alkali and/or an acid. Electrochemical graining is described in British Patent 896,563, JP-A-53-67507, JP-A-54-146234, and JP-B-48-28123. A combination of mechanical graining and electrochemical graining is disclosed in JP-A-53-123204 and JP-A-54-63902. A combination of mechanical graining and chemical graining using a saturated aqueous solution of a mineral acid aluminum salt, which is described in JP-A-56-55261, is also a choice. A grained surface can also be created by adhering particles with an adhesive or an equivalent means or by transferring an uneven surface profile of a continuous belt or a roll under pressure.

The above-described graining treatments can be carried out in any combination in any order or repeatedly any times. Where a plurality of graining treatments are combined, a graining treatment can be followed by a chemical treatment with an acid or alkali aqueous solution so that a subsequent graining treatment may be effected uniformly. The acid or alkali used for this purpose includes hydrofluoric acid, fluorozirconic acid, phosphoric acid, sulfuric acid, hydrochloric acid, nitric acid, sodium hydroxide, sodium silicate, and sodium carbonate. The acid or alkali aqueous solutions may be used either individually or as a mixture of two or more thereof. The chemical treatment is usually conducted with a 0.05 to 40% by weight aqueous solution of the acid or alkali at a liquid temperature of 40 to 10° C. for 5 to 300 seconds.

It is generally preferred that the grained aluminum plate, having smut resulting from the graining, be subjected to desmutting by rinsing or alkali etching. Desmutting methods include alkali etching described, e.g., in JP-B-48-28123 and sulfuric acid treatment described, e.g., JP-A-53-12739.

The grained aluminum plate is usually anodized to form an anodized layer for improving wearability, chemical resistance and water receptivity. Any electrolyte capable of forming a porous oxide film can be used for anodizing. Sulfuric acid, phosphoric acid, oxalic acid, chromic acid or a mixture thereof is used generally. The electrolyte concentration depends on the kind. Anodizing conditions are subject to variation according to the kind of the electrolyte. Generally speaking, the electrolyte concentration is 1 to 80% by weight, the liquid temperature is 5 to 70° C., the current density is 5 to 60 A/dm$^2$, the voltage is 1 to 100 V, and the electrolysis time is 10 seconds to 5 minutes. A suitable thickness of the anodized layer is 1.0 g/m$^2$ or more, preferably 2.0 to 6.0 g/m$^2$. With a thinner anodized layer than 1.0 g/m$^2$, the press life tends to be insufficient, and the non-image area of the resulting printing plate easily receives scratches, tending to cause scratch stains.

While it is the printing side of the aluminum plate that is anodized, lines of electric force go behind and form 0.01 to 3 g/m$^2$ of an anodized layer on the back side. Anodizing in an aqueous alkali solution (e.g., a several percent aqueous sodium hydroxide solution) or a molten salt or anodizing in an aqueous ammonium borate solution which forms a non-porous anodized film is also adoptable.

Anodizing may be preceded by formation of a hydration oxidized film according to the teachings of JP-A-4-148991 and JP-A-4-97896, formation of a silicate film in a metal silicate solution as taught in JP-A-63-56497 and JP-A-63-67295, or formation of various chemical films as described in JP-A-56-144195.

The anodized aluminum plate can further be treated with an organic acid or a salt thereof, or coated with an organic acid or a salt thereof as a primer coat on which the image-forming layer is to be formed. Useful organic acids and their salts include organic carboxylic acids, organic phosphonic acids, organic sulfonic acids and their salts, with organic carboxylic acids and their salts being preferred. Suitable organic carboxylic acids include aliphatic monocarboxylic acids, such as formic acid, acetic acid, propionic acid, butyric acid, lauric acid, palmitic acid, and stearic acid; unsaturated aliphatic monocarboxylic acids, such as oleic acid and linoleic acid; aliphatic dicarboxylic acids, such as oxalic acid, succinic acid, adipic acid, and maleic acid; oxycarboxylic acids, such as lactic acid, gluconic acid, malic acid, tartaric acid, and citric acid; aromatic carboxylic acids, such as benzoic acid, mandelic acid, salicylic acid, and phthalic acid. The salts include ammonium salts and those with the metals of the groups Ia, IIb, IIIb, IVa, and VIII. Preferred of them are formic acid, acetic acid, butyric acid, propionic acid, lauric acid, oleic acid, succinic acid, benzoic acid and their metal salts and ammonium salts. These compounds can be used either individually or as a combination thereof.

These acid compounds are preferably used as dissolved in water or an alcohol in a concentration of 0.001 to 10% by weight, particularly 0.01 to 1.0% by weight. The aluminum plate is immersed in the solution at 25 to 95° C., preferably 50 to 95° C., at a pH of 1 to 13, preferably 2 to 10, for 10 seconds to 20 minutes, preferably 10 seconds to 3 minutes, or the aluminum plate is coated with the solution.

The following compounds, in the form of a solution, are also useful as a treating agent or a primer for the anodized aluminum plate. The compounds include substituted or unsubstituted organic phosphonic acids, such as phenylphosphonic acid, naphthylphosphonic acid, alkylphosphonic acids, glycerophosphonic acid, methylenediphosphonic acid, and ethylenediphosphonic acid; substituted or unsubstituted organic phosphoric acids, such as phenylphopsphoric acid, naphthylphosphoric acid, alkylphosphoric acids, and glycerophosphoric acids; substituted or unsubstituted organic phosphinic acids, such as phenylphosphinic acid, naphthylphosphinic acid, alkylphosphinic acids, and glycerophosphinic acid; amino acids, such as glycine, β-alanine, valine, serine, threonine, aspartic acid, glutamic acid, arginine, lysine, tryptophane, parahydroxyphenylglycine, dihydroxyethylglycine, and anthranilic acid; aminosulfonic acids, such as sulfamic acid and cyclohexylsulfamic acid; and aminophosphonic acids, such as 1-aminomethylphosphonic acid, 1-dimethylaminoethylphosphonic acid, 2-aminoethylphosphonic acid, 2-aminopropylphosphonic acid, 4-aminophenylphosphonic acid, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid, and ethylenediaminetetramethylenephosphonic acid.

Salts between hydrochloric acid, sulfuric acid, nitric acid, a sulfonic acid (e.g., methanesulfonic acid) or oxalic acid and an alkali metal, ammonia, a lower alkanolamine (e.g., triethanolamine), a lower alkylamine, etc. are also useful as a treating agent or a primer.

Water-soluble polymers are also useful as a treating agent or a primer. Suitable water-soluble polymers include polyacrylamide, PVA, PVP, polyethyleneimine and mineral acid salts thereof, poly (meth) acrylic acid and metal salts thereof, polystyrenesulfonic acid and metal salts thereof, alkyl (meth)acrylate/2-acrylamido-2-methyl-1-propanesulfonic acid copolymers and metal salts thereof, trialkylammonium chloride methylstyrene homopolymers and copolymers with (meth) acrylic acid, and polyvinylphosphonic acid. Additionally, soluble starch, carboxymethyl cellulose, dextrin, hydroxyethyl cellulose, gum arabic, guar gum, sodium alginate, gelatin, glucose, sorbitol, and so forth are also useful. They can be used either individually or as a mixture thereof.

Where these compounds are used as a treating agent, they are preferably used as dissolved in water and/or methanol in a concentration of 0.001 to 10% by weight, particularly 0.01 to 1.0% by weight. The aluminum plate is immersed in the solution at 25 to 95° C., preferably 50 to 95° C., at a pH of 1 to 13, preferably 2 to 10, for 10 seconds to 20 minutes, preferably 10 seconds to 3 minutes.

Where used as a primer coat, too, the compounds are used as an aqueous and/or methanolic solution having the above-recited concentration. If necessary, the pH of the solution is adjusted to 1 to 12 by addition of a basic substance (e.g., ammonia, triethylamine or potassium hydroxide) or an acidic substance (e.g., hydrochloric acid or phosphoric acid) A yellow dye can be added to the coating solution for improving tone reproducibility. The primer coat is suitably applied to a dry coating weight of 2 to 200 mg/m$^2$, preferably 5 to 100 mg/m$^2$. A coating weight smaller than 2 mg/m$^2$ produces insubstantial effect on the purposes for which the primer is provided, for example, protection against staining. A coating weight greater than 200 mg/m$^2$ results in reduction of a press life.

An intermediate layer may be provided on the support to improve adhesion of the image-forming layer. An intermediate layer for adhesion improvement is generally made of a diazo resin or a phosphoric acid compound which is adsorbed by aluminum. The thickness of the intermediate layer is arbitrary but should be such that a uniform bond-forming reaction may take place with the image-forming layer when exposed to light, which is usually about 1 to 100 mg/m$^2$, preferably 5 to 40 mg/m$^2$, on a solid basis. The proportion of the diazo resin in the intermediate layer is 30 to 100%, preferably 60 to 100%.

Prior to the above-described treatment or primer coat application, the following treatments may be added to the anodized and rinsed aluminum plate for the purpose of, for example, preventing the anodized film from dissolving in a fountain solution, preventing image-forming layer components from remaining after platemaking, improving anodized film strength, improving anodized film water-wettability, and improving adhesion to an image-forming layer.

One of such treatments is a silicate treatment. The treatment is carried out by bringing the anodized aluminum plate into contact with an alkali metal silicate aqueous solution having a concentration of 0.1 to 30% by weight, preferably 0.5 to 15% by weight, and a pH of 10 to 13.5 (25° C.) at a liquid temperature of 5 to 80° C., preferably 10 to 70° C., still preferably 15 to 50° C., for 0.5 to 120 seconds, in any manner, for example, spraying or immersion. An alkali metal silicate aqueous solution having a pH lower than 10 (25° C.) undergoes gelation. An alkali metal silicate aqueous solution having a pH higher than 13.5 dissolves the anodized film.

The alkali metal silicate which can be used in the treatment includes sodium silicate, potassium silicate and lithium silicate. The pH of the treating solution is adjusted with sodium hydroxide, potassium hydroxide, lithium hydroxide, etc. The treating solution may contain an alkaline earth metal salt or a group IVb metal salt. The alkaline earth metal salt includes water-soluble salts, such as nitrates (e.g., calcium nitrate, strontium nitrate, magnesium nitrate, and barium nitrate), sulfates, hydrochlorides, phosphates, acetates, oxalates, and borates. The group IVb metal salt includes titanium tetrachloride, titanium trichloride, titanium potassium fluoride, titanium potassium oxalate, titanium sulfate, titanium tetraiodide, and zirconium oxychloride. The alkaline earth metal salts and the group IVb metal salts can be used either individually or as a combination of two or more thereof. These metal salts are added to a concentration of 0.01 to 10% by weight, preferably 0.05 to 5.0% by weight.

Another treatment is sealing, which is a well-known treatment for sealing off the pores of an anodized film. Sealing treatments include steam sealing, boiling (hot) water sealing, metal salt (e.g., chromate/bichromate or nickel acetate) sealing, fat and oil sealing, synthetic resin sealing, and cold sealing (with potassium ferricyanide or alkaline earth metal salts). From the standpoint of properties fit for use as a printing plate support (e.g., adhesion to an image-forming layer and water wettability), suitability to high-speed processing, low cost, and low pollution, steam sealing is relatively preferred. Steam sealing is carried out by, for example, applying pressurized or normal pressure steam at a relative humidity of 70% or higher and a steam temperature of 95° C. or higher for 2 to 180 seconds either continuously or intermittently as taught in JP-A-4-176690. Other sealing treatments include a treatment with hot water (about 80 to 100° C.) or an aqueous alkali solution by immersion or spraying and a treatment with a nitrous acid salt solution by immersion or spraying. The former treatment may be followed by the latter treatment. The nitrous acid salt includes ammonium nitrite and nitrites of the group Ia, IIa, IIb, IIIb, IVb, IVa, VIa, VIIa or VIII metal, e.g., $LiNO_2$, $NaNO_2$, $KNO_2$, $Mg(NO_2)_2$, $Ca(NO_2)_2$, $Zn(NO_3)_2$, $Al(NO_2)_3$, $Zr(NO_2)_4$, $Sn(NO_2)_3$, $Cr(NO_2)_3$, $Co(NO_2)_2$, $Mn(NO_2)_2$, and $Ni(NO_2)_2$. The alkali metal nitrites are preferred. These nitrites can be used as a combination of two or more thereof.

The conditions of sealing using the nitrous acid salt (particularly alkali metal nitrite) are subject to variation depending on the condition of the anodized aluminum and the kind of the alkali metal. In using sodium nitrite, for example, the treatment is usually carried out with a 0.001 to 10%, preferably 0.01 to 2%, by weight solution having a temperature of from room temperature to about 100° C., preferably 60 to 90° C., for a treating time of 15 to 300 seconds, preferably 10 to 180 seconds. The nitrite solution is preferably adjusted to a pH of 8.0 to 11.0, preferably 8.5 to 9.5, by addition of, for example, an alkali buffering solution. Useful alkali buffering solutions include, but are not limited to, a mixed aqueous solution of sodium hydrogencarbonate and sodium hydroxide, a mixed aqueous solution of sodium carbonate and sodium hydroxide, a mixed aqueous solution of sodium carbonate and sodium hydrogencarbonate, a mixed aqueous solution of sodium chloride and sodium hydroxide, a mixed aqueous solution of hydrochloric acid and sodium carbonate, and a mixed aqueous solution of sodium tetraborate and sodium hydroxide. The sodium in the above-recited examples may be replaced with potassium.

For further increasing adhesion to a heat-sensitive layer, the silicate treatment or sealing can be followed by a treatment with an acid aqueous solution and application of a hydrophilic primer as taught in JP-A-5-278362 or forming an organic acid layer as disclosed in JP-A-7-314937.

After the above-described treatments or application of a primer, a backcoat is applied to the back side of the support if desired. Preferred as a backcoat is an organic polymer layer as described in JP-A-5-45885 or a metal oxide layer formed by hydrolysis and polycondensation of an organic or inorganic metal compound as disclosed in JP-A-6-35174. Of these coating layers particularly preferred is a metal oxide layer prepared from a silicon alkoxide (e.g., $Si(OCH_3)_4$, $Si(OC_2H_5)_4$, $Si(OC_3H_7)_4$ or $Si(OC_4H_9)_4$) for inexpensiveness and availability of the silicon alkoxide and the developer resistance of the coat.

It is desirable for the finished support to have a center-line average surface roughness Ra of 0.10 to 1.2 $\mu$m. A smaller roughness results in reduced adhesion to a heat-sensitive layer, leading to a considerable reduction in press life. A greater roughness results in poor antistaining in printing. It is desirable for the finished support to have a color density of 0.15 to 0.65 in terms of reflection density. A support with a reflection density less than 0.15 causes too much halation in imagewise exposure, adversely influencing image formation. A support whose reflection density exceeds 0.65 shows poor image visibility after development, which makes plate inspection very difficult.

In the present invention, onpress developability is assured by using, as a support, an aluminum support prepared by graining followed by anodizing, particularly an aluminum support prepared by graining, anodizing, and silicate treatment.

If desired, a water-insoluble and water-receptive layer or a water-insoluble and water-receptive layer which generates heat on laser light irradiation can be formed on the aluminum support. A heat-insulating layer of an organic polymer may be provided between such a water-insoluble and water-receptive (and heat-generating) layer.

For example, a water-receptive layer made of silica fine particles and a hydrophilic resin can be formed on the aluminum support. The aforementioned photothermal material may be incorporated into this water-receptive layer to provide a heat-generating water-receptive layer. This layer not only prevents heat from escaping into the aluminum support but serves as a layer capable of generating heat on laser light irradiation. Where the heat-insulating organic polymer layer is provided between the water-receptive layer and the aluminum support, escape of heat to the support is further blocked.

The support is desirable non-porous to assure onpress developability. Such a water-swellable support as contains 40% or more of a hydrophilic organic polymer is unfavorable because printing ink is hardly wiped off the printing plate.

The water-receptive layer which can be used in the invention is a layer having a three-dimensionally crosslinked structure which does not dissolve in a fountain solution in lithographic printing using water and/or ink. The water-receptive layer is preferably made of a sol-gel converting colloid of an oxide or hydroxide of beryllium, magnesium, aluminum, silicon, titanium, boron, germanium, tin, zirconium, iron, vanadium, antimony or a transition metal. In some cases, the colloid may be a complex of these elements. The colloid has a mixed structure in which the element(s) form a network structure via an oxygen atom and have a free hydroxyl group or an alkoxy group. As a sol-gel reaction proceeds from an initial stage of hydrolysis and condensation, where many active alkoxy groups or hydroxyl groups are present, the colloidal particles grow and become inactive. The colloidal particles generally have a size of 2 nm to 500 nm. In the case of silica, spherical particles of 5 to 100 nm are preferred. Feather-like colloidal particles having a size of 10 nm by 100 nm, such as an aluminum colloid, are also effective. Spherical colloidal particles each having a diameter of 10 to 50 nm connected in a pearl necklace structure to a length of 50 to 400 nm are also useful.

The colloid can be used either alone or in combination with a hydrophilic resin. A crosslinking agent for the colloid may be added to accelerate crosslinking.

Colloids are often stabilized with a colloid stabilizer. A positively charged colloid is stabilized with an anionic compound, and a negatively charged colloid with a cationic compound. For example, a silicon colloid, which is negatively charged, is stabilized with an amine compound, and an aluminum colloid, which is positively charged, with a strong acid, such as hydrochloric acid or acetic acid. While a colloid applied to a support usually forms a transparent coating film at room temperature, evaporation of the solvent is not enough for complete gelation. Heating to a temperature at which the stabilizer is removed causes the colloidal particles to crosslink into a firm three-dimensional structure, which is a preferred water-receptive layer in the present invention.

A sol-gel reaction can also be achieved without using a colloid stabilizer by directly causing the starting substance (e.g., di-, tri- and/or tetraalkoxysilane) to hydrolyze and condense to form an appropriate sol, which is applied as such on a support and dried to complete the reaction. In this case, a three-dimensional crosslinked structure can be formed at a lower temperature than needed by the system containing a colloid stabilizer.

A colloid having an appropriate hydrolysis and condensation product dispersed and stabilized in an organic solvent is also suitable to form a water-receptive layer. A colloid of this type provides a three-dimensionally crosslinked film simply on removal of the solvent by evaporation. Use of a low-boiling organic solvent that evaporates at room temperature, such as methanol, ethanol, propanol, butanol, ethylene glycol monomethyl ether, ethylene glycol monoethyl ether or methyl ethyl ketone, makes room temperature drying possible. In particular, a colloid in methanol or ethanol is preferred for ease of hardening at room temperature.

The hydrophilic resin which can be used in combination with the colloid is preferably one having a hydrophilic group, such as hydroxyl, carboxyl, hydroxyethyl, hydroxypropyl, amino, aminoethyl, aminopropyl or carboxymethyl. Specific examples of such hydrophilic resins are gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acid and its salts, polymethacrylic acid and its salts, hydroxyethyl methacrylate homo- or copolymers, hydroxyethyl acrylate homo- or copolymers, hydroxypropyl methacrylate homo- or copolymers, hydroxypropyl acrylate homo- or copolymers, hydroxybutyl methacrylate homo- or copolymers, hydroxybutyl acrylate homo- or copolymers, polyethylene glycols, hydroxypropylene polymers, PVA, partially hydrolyzed polyvinyl acetate (degree of hydrolysis: 60% by weight or more, preferably 80% by weight or more), polyvinyl formal, polyvinyl butyral, PVP, homo- or copolyacrylamide, homo- or copolymethacrylamide, homo- or copoly-N-methylolacrylamide, and homo- or copoly(2-acrylamido-2-methylpropanesulfonic acid) or salts thereof.

Particularly preferred hydrophilic resins are water-insoluble hydroxyl-containing polymers, such as homo- or copolymers of hydroxyethyl methacrylate and hydroxyethyl acrylate copolymers. The hydrophilic resin which is water-soluble is used in a proportion of 40% by weight or less based on the total solids content of the water-receptive layer. The hydrophilic resin which is water-insoluble is used in a proportion of 20% by weight or less.

While the hydrophilic resin is serviceable as such, a crosslinking agent therefor can be used in combination to increase the press life. Suitable crosslinking agents for the hydrophilic resin include formaldehyde, glyoxal, polyisocyanates, an initial hydrolysis and condensation product of a tetraalkoxysilane, dimethylolurea, and hexamethylolmelamine.

A crosslinking agent for the colloid can also be added to the water-receptive layer. Suitable crosslinking agents for the colloid include an initial hydrolysis and condensation product of a tetraalkoxysilane, a trialkoxysilylpropyl-N,N,N-trialkylammonium halide, and an aminopropyltrialkoxysilane. A preferred amount of the colloid crosslinking agent is 5% by weight or less based on the total solids content of the water-receptive layer.

The water-receptive layer can further contain a hydrophilic photothermal material to improve thermal sensitivity. Particularly preferred photothermal materials are water-soluble infrared absorbing dyes, particularly cyanine dyes having a sulfonic acid group or a sulfonic acid alkali metal salt or amine salt which have been listed above. These dyes are preferably added in an amount of 1 to 20% by weight, particularly 5 to 15% by weight, based on the total weight of the water-receptive layer.

The three-dimensionally crosslinked water-receptive layer preferably has a thickness of 0.1 to 10 $\mu$m, particularly 0.5 to 5 $\mu$m. Too thin a water-receptive layer has poor durability, resulting in a poor press life. Too thick a water-receptive layer results in reduction of resolution.

The organic polymer as a heat-insulating layer, which is provided between the water-receptive layer and the aluminum support, is not particularly limited. Any organic polymers commonly employed, such as polyurethane resins, polyester resins, acrylic resins, cresol resins, resol resins, polyvinyl acetal resins, and vinyl resins, can be used. The organic polymer is applied in an amount of 0.1 to 5.0 g/m$^2$. A smaller coating weight is little effective on heat insulation. A larger coating weight results in deterioration of a press life of non-image area.

The lithographic printing plate precursor according to the invention is capable of imaging by imagewise exposure to a high output laser beam. An imaging means like a thermal head can be used as well. In the present invention, lasers emitting infrared or near-infrared light are used to advantage. A laser diode emitting light in the near-infrared region is especially preferred. Imagewise exposure is preferably conducted with a solid state laser or a semiconductor laser which emit infrared light having wavelengths of 760 to 1200 nm. Lasers having an output of 100 mW or higher are preferred. A multibeam laser device is preferably used for reduction of an exposure time. An exposure time per pixel is preferably within 20 usec. The irradiation energy is preferably 10 to 300 mJ/cm$^2$. The printing plate precursor of the invention is also capable of imaging with an ultraviolet lamp.

The imagewise exposed printing plate precursor is fixed to a plate cylinder of a printing press without any processing and used for printing. Printing is performed by (1) a method in which a fountain solution is fed to the printing plate to effect on press development, and ink is then fed to start printing, (2) a method in which a fountain solution and ink are fed to the printing plate to effect onpress development, and printing is then started, or (3) a method in which ink is fed to the printing plate, and a fountain solution is then fed concurrently with paper feeding to start printing.

It is possible that the unexposed printing plate precursor is fixed to a plate cylinder, imagewise exposed to light from a laser mounted on the press, and onpress-developed by feeding a fountain solution and/or ink as suggested in Japanese Patent 2938398. In preferred embodiments of the present invention, the printing plate precursor of the invention is, after imagewise exposure, either developed with water or an aqueous solution before being mounted on a press or mounted on a printing press without development to carry out printing.

EXAMPLES

The present invention will now be illustrated in greater detail with reference to Examples, but it should be understood that the invention is not construed as being limited thereto. Unless otherwise noted, all the percents are by weight.

Synthesis of Particulate Resin A-1 (Particulate Resin Having Hydrogen-donating Group):

In 18.0 g of a 4/1 (by weight) mixture of ethyl acetate and methyl ethyl ketone (MEK) were dissolved 6.0 g of polyhydroxystyrene and 1.5 g of a photothermal material (I-33), and the solution was mixed with 36 g of a 4% PVA (PVA 205, available from Kuraray Co., Ltd.) aqueous solution. The mixture was emulsified in a homogenizer at 10,000 rpm for 10 minutes. The emulsion was heated at 60° C. for 90 minutes while stirring to evaporate ethyl acetate and MEK to obtain an aqueous solution containing fine particles having an average particle size of 0.2 μm (designated particulate resin A-1). The solid content of the solution was 12.5%.

Synthesis of Particulate Resin A-2 (Particulate Resin Having a Hydrogen-Donating Group)

Particulate resin A-2 was prepared in the same manner as for particulate resin A-1, except for replacing the polyhydroxystyrene with a polymer represented by the following structural formula. The resulting particles had an average particle size of 0.25 μm, and the solid content of the solution was 13.5%.

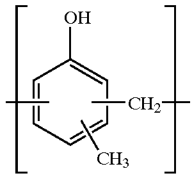

Synthesis of Particulate Resin B-1 (Particulate Resin Having Hydrogen-Accepting Group)

Particulate resin B-1 was prepared in the same manner as for particulate resin A-1, except for replacing the polyhydroxystyrene with a polymer represented by the following formula. The resulting particles had an average particle size of 0.22 μm, and the solid content of the solution was 13.0%.

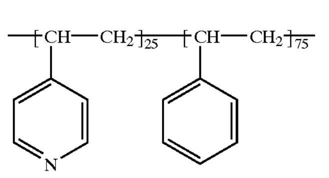

Synthesis of Particulate Resin B-2 (Particulate Resin Having Hydrogen-Accepting Group)

In a 2000 ml three-necked flask were put 2.1 g of sodium dodecylsulfate and 815 ml of distilled water and mixed at 75° C. for 10 minutes in a nitrogen stream. To the solution was added a solution consisting of 0.462 g of potassiumpersulfate, 11.3 ml of distilled water, and 3.5 ml of a 1M aqueous solution of sodium hydrogencarbonate. To the mixture was added dropwise 105.14 g of 4-vinylpyridine over a 3-hour period. After completion of the addition, a mixture of 0.462 g of potassium persulfate, 14.3 ml of distilled water, and 3.5 ml of a 1M aqueous solution of sodium hydrogencarbonate was added, and stirring was continued for an additional 3 hour period. The resulting reaction mixture was cooled to room temperature and filtered through a glass filter to obtain particulate resin B-2. The particles had an average particle size of 0.15 μm, and the aqueous solution had a solid content of 11%.

Synthesis of Particulate Resin B-3 (Particulate Resin Having Hydrogen-Accepting Group)

In 18.0 g of a 4/1 (by weight) mixture of ethyl acetate and MEK were dissolved 6.0 g of a polymer represented by the following formula and 1.5 g of a photothermal material (I-33), and the solution was emulsified in a homogenizer at 10, 000 rpm for 10 minutes. The emulsion was heated at 60° C. for 90 minutes while stirring to evaporate ethyl acetate and MEK to obtain an aqueous solution containing fine particles having an average particle size of 0.17 μm (designated particulate resin B-3). The solid content of the solution was 15.5%.

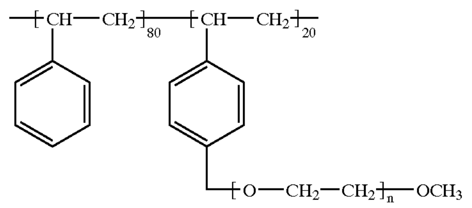

Synthesis of Particulate Resin B-4 (Particulate Resin Having Hydrogen-Accepting Group)

In a 2000 ml three-necked flask were put 1.6 g of sodium dodecylsulfate and 842 ml of distilled water and mixed at 75° C. for 10 minutes in a nitrogen stream. To the solution was added a solution consisting of 0.462 g of potassiumpersulfate, 11.3 ml of distilled water, and 3.5 ml of a 1M aqueous solution of sodium hydrogencarbonate. To the mixture was added dropwise a mixture of 68.52 g of ethyl methacrylate and 40.04 g of methyl methacrylate over 3 hours. After completion of the addition, a mixture of 0.462 g of potassium persulfate, 14.3 ml of distilled water, and 3.5 ml of a 1M aqueous solution of sodium hydrogencarbonate was added, and stirring was continued for an additional 3 hour period. The resulting reaction mixture was cooled to room temperature and filtered through a glass filter to obtain particulate resin B-4. The particles had an average particle size of 0.1 μm, and the aqueous solution had a solid content of 11.2%.

Preparation of Printing Plate Precursor I

A 0.24 mm thick aluminum plate (JIS A1050) was electrochemically grained in a nitric acid bath, anodized in a sulfuric acid bath, and treated with a silicate aqueous solution in a known manner. The resulting aluminum support had an Ra of 0.25 μm, 2.5 $g/m^2$ of an anodized layer, and 10 $mg/m^2$ of a silicon deposit.

Solution (1) of the following formulation was applied to the aluminum support with a bar to a dry coating weight of 0.5 $g/m^2$ and dried at 60° C. for 3 minutes to prepare a lithographic printing plate precursor having a heat-sensitive layer, designated precursor I.

Solution (1)

| | |
|---|---|
| Particulate resin A-1 | 40.0 g |
| Particulate resin B-1 | 38.5 g |
| Water | 64.5 g |

Preparation of Printing Plate Precursor II

Lithographic printing plate precursor II was prepared in the same manner as for precursor I, except for replacing solution (1) with solution (2) having the following formulation. The dry coating thickness of the heat-sensitive layer was 0.6 g/$m^2$.

Solution (2):

| | |
|---|---|
| Particulate resin A-2 | 37.0 g |
| Polyethylene oxide (weight average molecular weight: 25,000) | 1.0 g |
| Infrared absorbing dye (I-32) | 0.3 g |
| Water | 37.5 g |

Preparation of Printing Plate Precursor III

Printing plate precursor III was prepared in the same manner as for precursor I, except for replacing solution (1) with solution (3) of the following formulation. The dry coating weight of the heat-sensitive layer was 0.6 g/$m^2$.

Solution (3)

| | |
|---|---|
| Polyacrylic acid (weight average molecular weight: 45,000) | 1.0 g |
| Particulate resin B-2 | 45.5 g |
| Infrared absorbing dye (I-32) | 0.3 g |
| Water | 32.0 g |

Preparation of Printing Plate Precursor IV

Printing plate precursor IV was prepared in the same manner as for precursor I, except for replacing solution (1) with solution (4) of the following formulation. The dry coating weight of the heat-sensitive layer was 0.8 g/$m^2$.

Solution (4)

| | |
|---|---|
| Particulate resin A-1 | 40.0 g |
| Particulate resin B-3 | 32.3 g |
| Polyacrylic acid (weight average molecular weight: 25,000) | 1.0 g |
| Infrared absorbing dye (I-32) | 0.3 g |
| Water | 65.0 g |

Preparation of Printing Plate Precursor V

Printing plate precursor V was prepared in the same manner as for precursor I, except for replacing solution (1) with solution (5) of the following formulation. The dry coating weight of the heat-sensitive layer was 0.5 g/$m^2$.

Solution (5)

| | |
|---|---|
| Particulate resin A-2 | 40.0 g |
| Particulate resin B-4 | 44.6 g |
| Water | 63.4 g |

Preparation of Printing Plate Precursor VI

Printing plate precursor VI was prepared in the same manner as for precursor I, except for replacing solution (1) with solution (6) of the following formulation. The dry coating weight of the heat-sensitive layer was 0.6 g/$m^2$.

Solution (6)

| | |
|---|---|
| Particulate resin B-1 | 38.5 g |
| Polyacrylamide (weight average molecular weight: 40,000) | 2.0 g |
| Infrared absorbing dye (I-32) | 0.3 g |
| Water | 37.5 g |

Preparation of Printing Plate Precursor VII

A 0.24 mm thick aluminum plate (JIS A1050) was electrochemically grained in a nitric acid bath, anodized in a sulfuric acid bath, and treated with a silicate aqueous solution in a known manner. The resulting aluminum support had an Ra of 0.25 $\mu$m, 2.5 g/$m^2$ of an anodized layer, and 10 mg/$m^2$ of a silicon deposit.

Solution (7) having the following formulation was applied to the aluminum support with a bar to a dry coating weight of 0.5 g/$m^2$ and dried at 60° C. for 3 minutes to prepare a lithographic printing plate precursor having a heat-sensitive layer.

Solution (7)

| | |
|---|---|
| Particulate resin A-2 | 37.0 g |
| Particulate resin B-1 | 38.5 g |
| Water | 67.5 g |

Solution (8) having the following formulation was applied to the heat-sensitive layer with a bar to a dry coating weight of 0.75 g/$m^2$ and dried at 60° C. for 3 minutes to form an overcoating layer.

Solution (8)

| | |
|---|---|
| Cellogen 5A (available from Dai-ichi Kogyo Seiyaku Co., Ltd.) | 5.0 g |
| Infrared absorbing dye (I-32) | 0.3 g |
| Megafac F171 (available from Dainippon Ink & Chemicals, Inc.) | 1.0 g |
| Water | 94.7 g |

Preparation of Printing Plate Precursor VIII

Printing plate precursor VIII was prepared in the same manner as for precursor I, except for replacing solution (1) with solution (9) of the following formulation. The dry coating weight of the heat-sensitive layer was 0.5 g/$m^2$.

Solution (9)

| | |
|---|---|
| Particulate resin A-2 | 40.0 g |
| Water | 100.0 g |

Preparation of Printing Plate Precursor IX

Printing plate precursor IX was prepared in the same manner as for precursor I, except for replacing solution (1) with solution (10) having the following formulation. The dry coating weight of the heat-sensitive layer was 0.6 g/$m^2$.

Solution (10)

| | |
|---|---|
| Particulate resin B-2 | 45.5 g |
| Polyethylene oxide | 1.0 g |
| Infrared absorbing dye (I-32) | 0.5 g |
| Water | 100.0 g |

EXAMPLES 1 TO 7 AND COMPARATIVE EXAMPLES 1 AND 2

Each of the printing plate precursors I to IX was scanned with a semiconductor laser emitting infrared rays having a wavelength of 840 nm at a fast scan speed of 2.0 m/sec and then soaked in distilled water for 1 minute. The irradiation energy of the laser that gave the minimum line width in the non-image area as observed under an optical microscope was taken as a sensitivity.

Separately, each of the printing plate precursors I to IX was scanned with a semiconductor laser emitting infrared rays having a wavelength of 840 nm at a fast scan speed of 2.0 m/sec or 4.0 m/se. The plate as exposed was mounted on a printing machine, Heidelberg KOR-D, and printing was carried out in a usual manner. The printing performance was evaluated in terms of whether any background stain occurred on the 3, 000th print and how many satisfactory prints were obtained in continuous printing (press life). The results obtained are shown in Table 1 below.

TABLE 1

| | Plate Pre-cursor | Sensitivity ($mJ/cm^2$) | Background Stains 2.0 m/s | Background Stains 4.0 m/s | Press Life 2.0 m/s | Press Life 4.0 m/s |
|---|---|---|---|---|---|---|
| Example 1 | I | 140 | nil | nil | 50,000 | 50,000 |
| Example 2 | II | 150 | nil | nil | 40,000 | 40,000 |
| Example 3 | III | 160 | nil | nil | 35,000 | 30,000 |
| Example 4 | IV | 160 | nil | nil | 40,000 | 40,000 |
| Example 5 | V | 150 | nil | nil | 45,000 | 40,000 |
| Example 6 | VI | 140 | nil | nil | 35,000 | 30,000 |
| Example 7 | VII | 160 | nil | nil | 30,000 | 25,000 |
| Compara. Example 1 | VIII | 150 | nil | nil | 20,000 | 10,000 |
| Compara. Example 2 | IX | 160 | nil | nil | 15,000 | 8,000 |

As is apparent from the results in Table 1, the printing plate precursors I to VII of Examples 1 to 7 which contain the resin having a hydrogen-donating group (resin A) and the resin having a hydrogen-accepting group (resin B) all exhibit high sensitivity and provide printing plates which cause no background staining and have a press life of about 30,000 to 50,000 prints irrespective of whether the scan speed is 2.0 m/sec or 4.0 m/sec.

To the contrary, the printing plate precursor VIII (Comparative Example 1) which contains only the resin A, while exhibiting satisfactory sensitivity and stain resistance, provides only 20,000 satisfactory prints when exposed at a scan speed of 2.0 m/sec. Doubling the scan speed results in a poorer press life of 10,000 prints. The printing plate precursor IX (Comparative Example 2) which contains only the resin B, while satisfactory in sensitivity and stain resistance, has a poor press life of 15,000 prints when exposed at a scan speed of 2.0 m/sec. Doubling the scan speed only results in a poorer press life of 8,000 prints. These poor press lives of the comparative printing plate precursors are attributed to insufficient strength of the resin layer formed on laser irradiation because of lack of hydrogen bonding.

The lithographic printing plate precursor according to the present invention is a processless plate precursor which, after imagewise exposure, is either developed with water or an aqueous solution before being mounted on a printing press or developed with water and/or ink after being mounted on a printing press (onpress developability) but needs no special processing treatments, such as a wet chemical development or rubbing. It has high sensitivity to provide a lithographic printing plate with high impression capacity which produces prints free from color remaining or staining. In particular, the present invention provides a lithographic printing plate precursor fit for direct imaging of digital image data by use of a solid state laser or a semiconductor laser emitting infrared light.

The entire disclosure of each and every foreign patent application from which the benefit of foreign priority has been claimed in the present application is incorporated herein by reference, as if fully set forth herein.

What is claimed is:

1. A lithographic printing plate precursor comprising:

a support having a water-wettable surface; and a heat-sensitive layer comprising a first resin having a hydrogen-donating group and a second resin having a hydrogen-accepting group, wherein at least one of the first resin and the second resin is particles.

2. The lithographic printing plate precursor according to claim 1, wherein both of the first resin and the second resin are particles.

3. The lithographic printing plate precursor according to claim 2, wherein the hydrogen-donating group is selected from a hydroxyl group, a carboxyl group and a nitrogen atom having a hydrogen atom.

4. The lithographic printing plate precursor according to claim 2, wherein the hydrogen-accepting group is selected from a carbonyl group, an ether group and a nitrogen atom that does not have a hydrogen atom.

5. The lithographic printing plate precursor according to claim 1, wherein the hydrogen-donating group is selected from a hydroxyl group, a carboxyl group, and a nitrogen atom having a hydrogen atom.

6. The lithographic printing plate precursor according to claim 1, wherein the hydrogen-accepting group is selected from a carbonyl group, an ether group and a nitrogen atom that does not have a hydrogen atom.

7. The lithographic printing plate precursor according to claim 1, wherein both of the first resin and the second resin are particles having an average particle size of from 0.01 $\mu$m to 20 $\mu$m, have a melting point of 70° C. or higher and have a weight average molecular weight of more than 2000.

8. The lithographic printing plate precursor according to claim 1, wherein the second resin comprises a nitrogen atom that does not have a hydrogen atom.

9. The lithographic printing plate precursor according to claim 1, wherein the first resin comprises a phenolic hydroxyl group.

10. The lithographic printing plate precursor according to claim 1, which further comprises an overcoating layer provided on the heat-sensitive layer, wherein at least one of the heat-sensitive layer and the overcoating layer comprises a photothermal material that is capable of absorbing a light having a wavelength of 700 nm or longer.

* * * * *